(12) United States Patent
Yang et al.

(10) Patent No.: US 11,080,218 B2
(45) Date of Patent: Aug. 3, 2021

(54) INTERFACE CHIP USED TO SELECT MEMORY CHIP AND STORAGE DEVICE INCLUDING INTERFACE CHIP AND MEMORY CHIP

(71) Applicant: Samsung Electronics Co., Ltd., Suwon-si (KR)

(72) Inventors: Manjae Yang, Hwaseong-si (KR); Jangwoo Lee, Seoul (KR); Hwasuk Cho, Yongin-si (KR); Jeongdon Ihm, Seongnam-si (KR)

(73) Assignee: Samsung Electronics Co., Ltd., Gyeonqqi-do (KR)

( * ) Notice: Subject to any disclaimer, the term of this patent is extended or adjusted under 35 U.S.C. 154(b) by 250 days.

(21) Appl. No.: 16/425,105

(22) Filed: May 29, 2019

(65) Prior Publication Data

US 2020/0167298 A1 May 28, 2020

(30) Foreign Application Priority Data

Nov. 23, 2018 (KR) ........................ 10-2018-0146019

(51) Int. Cl.
*G06F 13/16* (2006.01)
*G11C 7/10* (2006.01)
(Continued)

(52) U.S. Cl.
CPC ........ *G06F 13/1689* (2013.01); *G06F 3/0604* (2013.01); *G06F 3/0683* (2013.01);
(Continued)

(58) Field of Classification Search
CPC .. G06F 13/1689; G06F 3/0604; G06F 3/0683; G06F 2212/1024; G06F 12/0897;
(Continued)

(56) References Cited

U.S. PATENT DOCUMENTS 7,126,873 B2   10/2006   See et al.
7,230,986 B2 *  6/2007   Wise ..................... G06F 9/3867
                                                    375/240.26
(Continued)

FOREIGN PATENT DOCUMENTS

KR   10-2018-0019418 A   2/2018

*Primary Examiner* — Fernando Hidalgo
(74) *Attorney, Agent, or Firm* — Harness, Dickey & Pierce, P.L.C.

(57) ABSTRACT

An interface chip includes a command decoder configured to decode a command included in data input/output signals based on a clock signal, clock masking circuitry configured to generate a masking clock signal including an edge corresponding to a first edge among first to n-th edges of the clock signal (n being an integer of 2 or more), clock latency circuity configured to transmit, to an external chip, a latency clock signal including edges corresponding to the second to n-th edges of the clock signal, chip select circuitry configured to generate a chip select signal based on an address included in the data input/output signals and the masking clock signal, and chip enable control circuitry configured to receive a chip enable signal indicating a channel for the data input/output signals and transmit the chip enable signal to the external chip based on the chip select signal.

20 Claims, 10 Drawing Sheets

(51) Int. Cl.
*G06F 3/06* (2006.01)
*G11C 8/12* (2006.01)
*G11C 5/04* (2006.01)
*G11C 8/06* (2006.01)
*G11C 16/06* (2006.01)
*G11C 16/08* (2006.01)

(52) U.S. Cl.
CPC ............... *G11C 5/04* (2013.01); *G11C 7/10* (2013.01); *G11C 8/06* (2013.01); *G11C 8/12* (2013.01); *G11C 16/06* (2013.01); *G11C 16/08* (2013.01)

(58) Field of Classification Search
CPC ..... G06F 2212/7203; G06F 2212/7208; G06F 12/0246; G11C 8/12; G11C 5/04; G11C 8/06; G11C 16/06; G11C 16/08; G11C 7/10; G11C 7/222
USPC ...................................................... 365/233.1
See application file for complete search history.

(56) References Cited

U.S. PATENT DOCUMENTS

| | | |
|---|---|---|
| 7,342,816 B2 | 3/2008 | Bartley et al. |
| 8,122,202 B2 | 2/2012 | Gillingham |
| 9,589,614 B2 | 3/2017 | Lee et al. |
| 10,615,126 B2 * | 4/2020 | Byeon ................ H01L 25/0657 |
| 2013/0094271 A1 | 4/2013 | Schuetz |
| 2016/0189760 A1 * | 6/2016 | Kim ....................... G11C 7/222 |
| | | 365/193 |
| 2017/0364469 A1 | 12/2017 | Crisp |
| 2018/0052639 A1 * | 2/2018 | Woo ....................... G06F 3/0604 |
| 2018/0151509 A1 * | 5/2018 | Byeon ................... H01L 23/544 |
| 2019/0324679 A1 * | 10/2019 | Woo ......................... G11C 7/20 |

* cited by examiner

INTERFACE CHIP USED TO SELECT MEMORY CHIP AND STORAGE DEVICE INCLUDING INTERFACE CHIP AND MEMORY CHIP

CROSS-REFERENCE TO RELATED APPLICATIONS

This application claims priority under 35 U.S.C. § 119 to Korean Patent Application No. 10-2018-0146019 filed on Nov. 23, 2018, in the Korean Intellectual Property Office, the disclosures of which are incorporated by reference herein in their entireties.

BACKGROUND

A storage device may include a controller and a plurality of memory chips. As a capacity of the storage device increases, the number of memory chips included in the storage device may increase. As the number of memory chips connected to the controller increases, a load of the controller may increase, and the number of paths between the controller and the memory chips may increase. Accordingly, an interface chip may be included to reduce the load on the controller.

However, as the number of memory chips increases, the number of interface chips connecting the controller and the memory chips may also increase. If the controller has to select both the interface chips and the memory chips, the number of paths used to select the interface chips and the memory chips may increase.

SUMMARY

Some example embodiments of some inventive concepts include interface chips used to select memory chips and/or storage devices including such memory chips and/or interface chips.

Some example embodiments may include an interface chip, where the interface chip may include a command decoder configured to decode a command included in data input/output signals based on a clock signal, clock masking circuitry configured to generate a masking clock signal including an edge corresponding to a first edge among first to n-th edges of the clock signal (n being an integer of 2 or more), clock latency circuitry configured to transmit, to an external chip, a latency clock signal including edges corresponding to the second to n-th edges of the clock signal, a chip select circuitry configured to generate a chip select signal based on an address included in the data input/output signals and the masking clock signal, and chip enable control circuitry configured to receive a chip enable signal indicating a channel for the data input/output signals and transmit the chip enable signal to the external chip based on the chip select signal.

Some example embodiments may include a storage device may include a controller configured to generate data input/output signals including a command, first to n-th addresses, and a clock signal including first to n-th edges (n being an integer of 2 or more), and semiconductor chips of first to n-th stages configured to decode the command included in the data input/output signals and respectively sample the first to n-th addresses based on the first to n-th edges of the clock signal, wherein the controller is configured to select semiconductor chips of the first to n-th stages that respectively correspond to the first to n-th addresses.

Some example embodiments may include a storage device, the storage device including semiconductor chips of first to n-th stages ("n" being an integer of 2 or more) and a controller configured to transmit data input/output signals including a command for selecting the a semiconductor chip of the n-th stage, a clock signal including first to n-th edges, and a chip enable signal to the first semiconductor chip of the first stage, wherein, when "n" is 2, based on a the first edge of the clock signal, the semiconductor chip of the first stage is configured top receive the chip enable signal from the controller and transmits the chip enable signal to a semiconductor chip of the n-th stage, and wherein, when "n" is greater than 2, based on the first to (n−1)-th edges of the clock signal, the semiconductor chips of the first to (n−1)-th stages are configured, respectively, to receive the chip enable signal from the controller and the semiconductor chips of first to (n−2)-th stages and transmit the chip enable signal to the semiconductor chips of the second to n-th stages, based on first to (n−1)-th edges of the clock signal.

DETAILED DESCRIPTION

Figure 1:
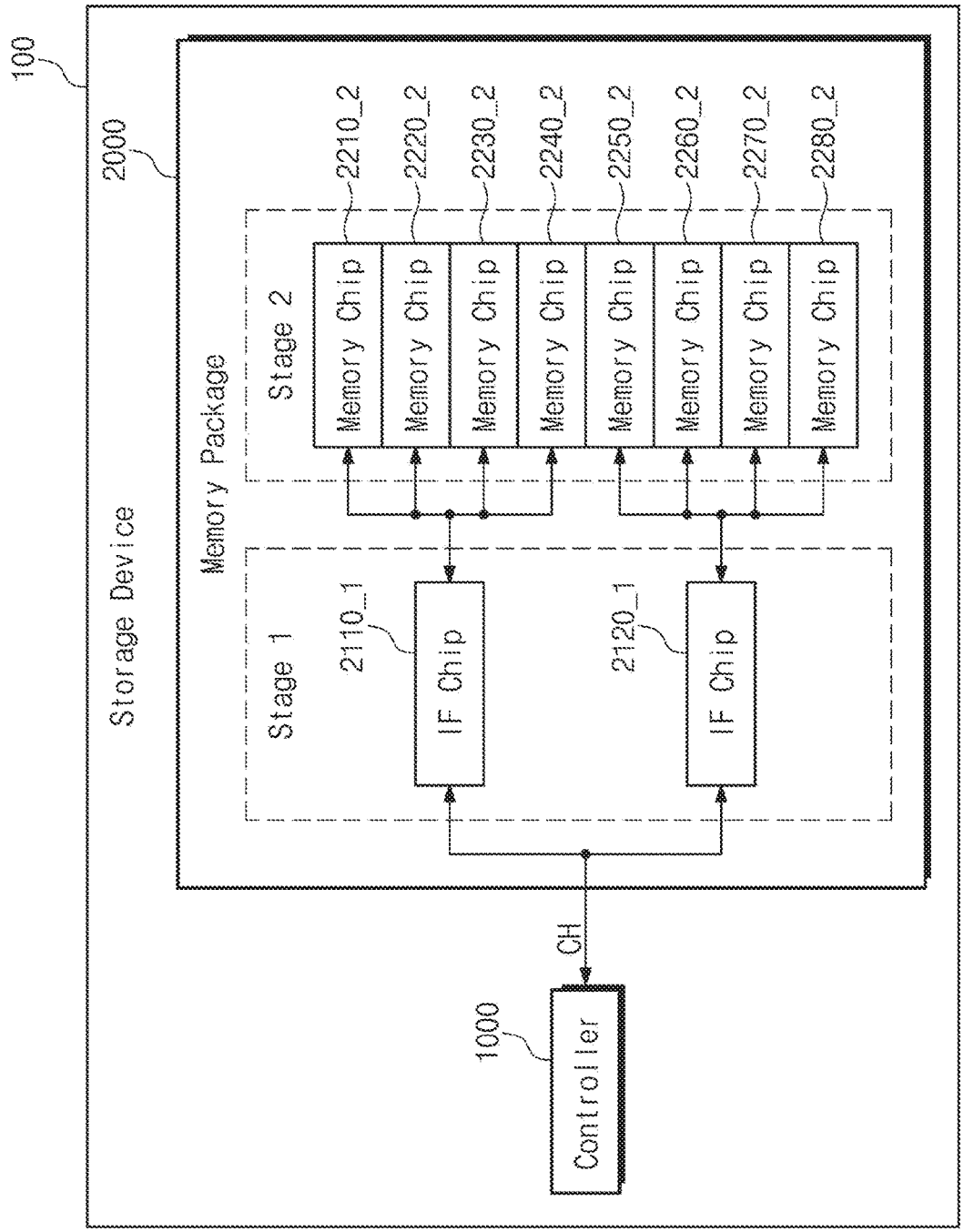
FIG. 1 illustrates a block diagram of a storage device according to some example embodiments of some inventive concepts.

FIG. 1 illustrates a block diagram of a storage device according to some example embodiments of some inventive concepts. For example, a storage device 100 may be a solid state drive (SSD), a memory card, a micro secure digital (SD) card, an embedded multi-media card (eMMC), universal flash storage (UFS), etc., but some example embodiments may include inventive concepts that are not related to the type of memory storage. The storage device 100 may be also referred to as a "memory system." The storage device 100 may include a controller 1000 and a memory package 2000.

In some example embodiments, the controller 1000 may be configured to control overall operations of the storage device 100. The controller 1000 may be configured to process a request of a host (not illustrated) outside the storage device 100. The controller 1000 may be configured to communicate with the memory package 2000 through a channel CH. In detail, the controller 1000 may be configured to access the memory package 2000 through the channel CH in compliance with an interface standard (e.g., a toggle double data rate (DDR) standard or a DDR synchronous dynamic random access memory (SDRAM) standard) between the controller 1000 and memory chips 2210_2 to 2280_2. The number of channels CH between the controller 1000 and the memory package 2000 may be one or more. The number of memory packages 2000 per channel CH may be one or more. Some example embodiments may include some inventive concepts that may differ from the number of channels CH or the number of memory packages 2000 illustrated in FIG. 1.

In some example embodiments, the memory package 2000 may include interface chips 2110_1 and 2120_1 and the memory chips 2210_2 to 2280_2. The interface chips 2110_1 and 2120_1 may connect the controller 1000 and the memory chips 2210_2 to 2280_2. The memory chips 2210_2 to 2280_2 may be configured to store program data and/or write data that is transmitted through the interface chips 2110_1 and 2120_1, based on a control signal(s) of the controller 1000 transmitted through the interface chips 2110_1 and 2120_1. The memory chips 2210_2 to 2280_2 may be configured to transmit read data to the controller 1000 through the interface chips 2110_1 and 2120_1, based on a control signal(s) of the controller 1000 transmitted through the interface chips 2110_1 and 2120_1. As used herein, the term "based on" may mean "on condition of," "in response to," and/or "following."

The interface chips 2110_1 and 2120_1 may be configured to configure a first stage. The first stage may connect the controller 1000 with a second stage. The first stage may not include the memory chips 2210_2 to 2280_2. The memory chips 2210_2 to 2280_2 may be configured to configure the second stage. The second stage, which in the example of FIG. 1 is the last stage, may not include the interface chips 2110_1 and 2120_1.

In an example embodiment, a controller 1000 may be configured to select and/or access one target memory chip of the memory chips 2210_2 to 2280_2 per channel CH. Unlike illustration of FIG. 1, in some example embodiments, a controller 1000 may be configured to communicate directly with the memory chips 2210_2 to 2280_2 rather than the interface chips 2110_1 and 2120_1. In some such example embodiments, the controller 1000 may be configured to select one of the eight memory chips 2210_2 to 2280_2 using paths between the controller 1000 and one or more of the eight memory chips 2210_2 to 2280_2. In some example embodiments, as the number of the memory chips 2210_2 to 2280_2 increases, paths between the controller 1000 and the memory chips 2210_2 to 2280_2 may cause an increase in a load and/or a decrease in the capability (e.g., ability) of the controller 1000 associated with driving the memory chips 2210_2 to 2280_2.

In other example embodiments, and as illustrated in FIG. 1, a controller 1000 may be configured to communicate with the memory chips 2210_2 to 2280_2 through the interface chips 2110_1 and 2120_1. In some example embodiments, the controller 1000 may be configured to select one of the interface chips 2110_1 and 2120_1 of the first stage and/or to select a target memory chip of the memory chips 2210_2 to 2280_2 of the second stage. In FIG. 1, since the number of memory chips directly connected with the controller 1000 is "2", a load of paths between the controller 1000 and the interface chips 2110_1 and 2120_1 may be smaller than a load of paths between the controller 1000 and the memory chips 2210_2 to 2280_2 in example embodiments that do not include the interface chips 2110_1 and 2120_1. In some example embodiments, the interface chips 2110_1 and 2120_1 may improve a driving capacity of the controller 1000.

As described above, in some example embodiments, the controller 1000 may be configured to select one of the interface chips 2110_1 and 2120_1 of the first stage and/or to select one of the memory chips 2210_2 to 2280_2 of the second stage. Each of the interface chips 2110_1 and 2120_1 and the memory chips 2210_2 to 2280_2 may be referred to as a "semiconductor chip." That is, a semiconductor chip may indicate an interface chip or a memory chip.

In some example embodiments, the number of stages included in one channel CH, the number of semiconductor chips included in each of stages, the number of semiconductor chips to be driven by the controller 1000, and the number of other semiconductor chips to be driven by one semiconductor chip may differ from the illustration of FIG. 1. Also, in some example embodiments such as illustrated in FIG. 1, semiconductor chips may be connected to each other depending on a tree structure. In other example embodiments, a way to connect semiconductor chips may differ from the illustration of FIG. 1. For example, semiconductor chips may be connected to each other based on other structures (e.g., a daisy chain structure or a hierarchy structure).

Figure 2:
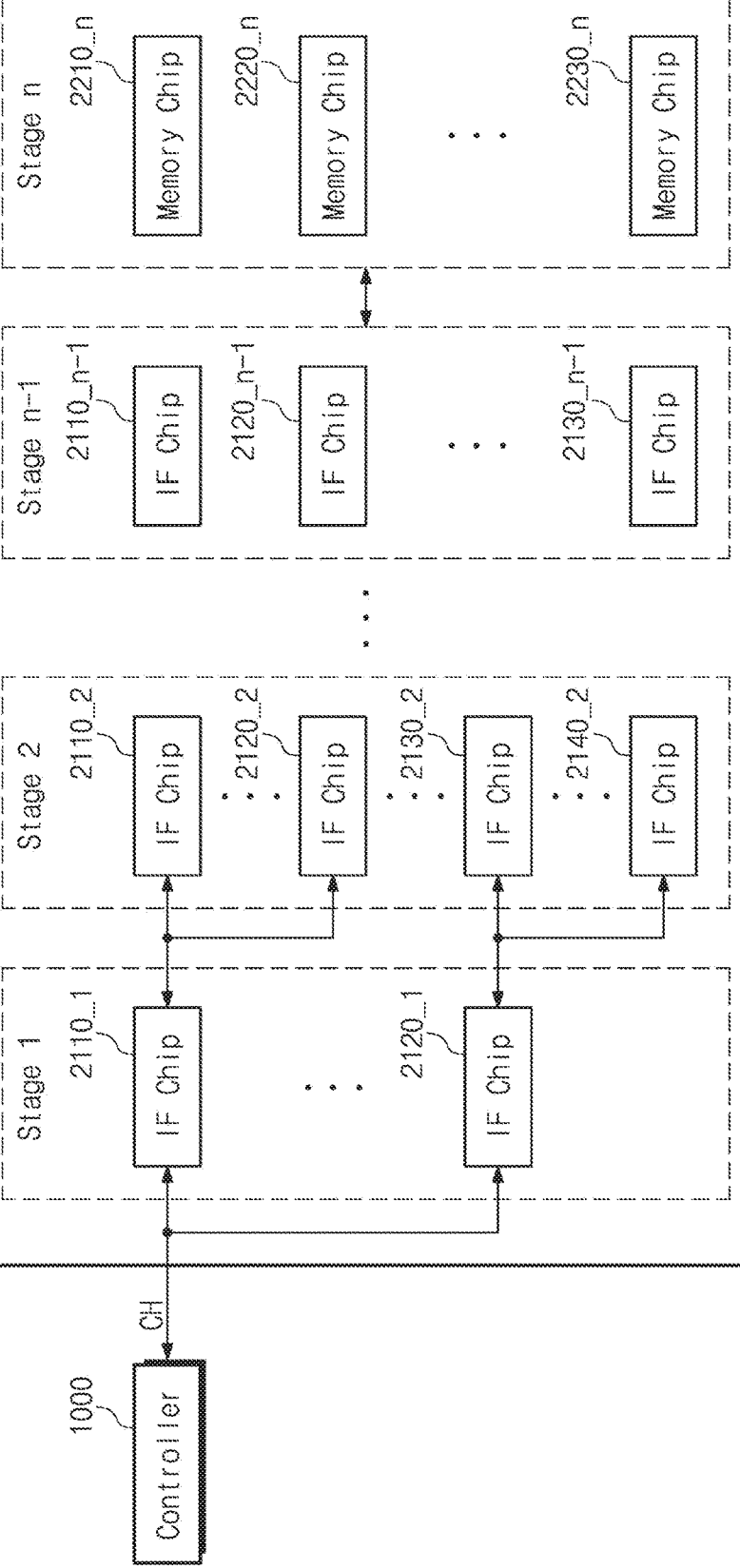
FIG. 2 illustrates a block diagram of a storage device according to some example embodiments of some inventive concepts.

FIG. 2 illustrates a block diagram of a storage device according to some example embodiments of some inventive concepts. In some example embodiments, the storage device 100, the controller 1000, and the memory package 2000 of FIG. 2 may be substantially identical to the storage device 100, the controller 1000, and the memory package 2000 of FIG. 1. However, in some example embodiments including the illustration of FIG. 2, a memory package 2000 of FIG. 2 may include first to n-th stages (n being an integer of 2 or more). Here, "n" may indicate the number of stages. In some example embodiments including FIG. 1, "n" may be 2, and in other example embodiments including FIG. 2, "n" may be 2 or more.

In some example embodiments including FIG. 2, ann-th stage may be the last stage. The controller 1000 may be configured to select memory chips 2210_n to 2230_n of the n-th stage through the first to (n−1)-th stages 2110_1 to 2120_1, 2110_2 to 2140_2 . . . 2110_n−1 to 2130_n−1.

In some example embodiments, the controller 1000 may be configured to select one semiconductor chip at the first stage, and/or to select one semiconductor chip at the second stage. In some example embodiments, the controller 1000 may be configured to select (n−1) semiconductor chips at the first to (n−1)-th stages in sequence, and then select one target memory chip at the n-th stage. Since the controller 1000 is configured to select one semiconductor chip per stage in sequence, "n" may indicate the number of semiconductor chips (e.g., first to n-th semiconductor chips of the first to n-th stages) that the controller 1000 may be configured to select at the first to n-th stages in order for the controller 1000 to access a target memory chip. In some example embodiments, each of the first to n-th stages may correspond to a selection unit of the controller 1000, and/or semiconductor chips of the storage device 100 may be arranged as first to n-th stages.

In some example embodiments such as illustrated in FIG. 2, the controller 1000 may be configured to communicate directly with interface chips 2110_1 and 2120_1 of the first stage; the interface chip 2110_1 of the first stage may be configured to communicate directly with the interface chips 2110_2 to 2120_2 of the second stage; and/or the interface chip 2120_1 of the first stage may be configured to communicate directly with the interface chips 2130_2 to 2140_2 of the second stage. However, in some embodiments, the number of the interface chips 2110_1 and 2120_1 directly driven by the controller 1000 and the number of the interface chips 2110_2 to 2120_2 directly driven by one interface chip 2110_1 may differ from the illustration of FIG. 2.

Figure 3:
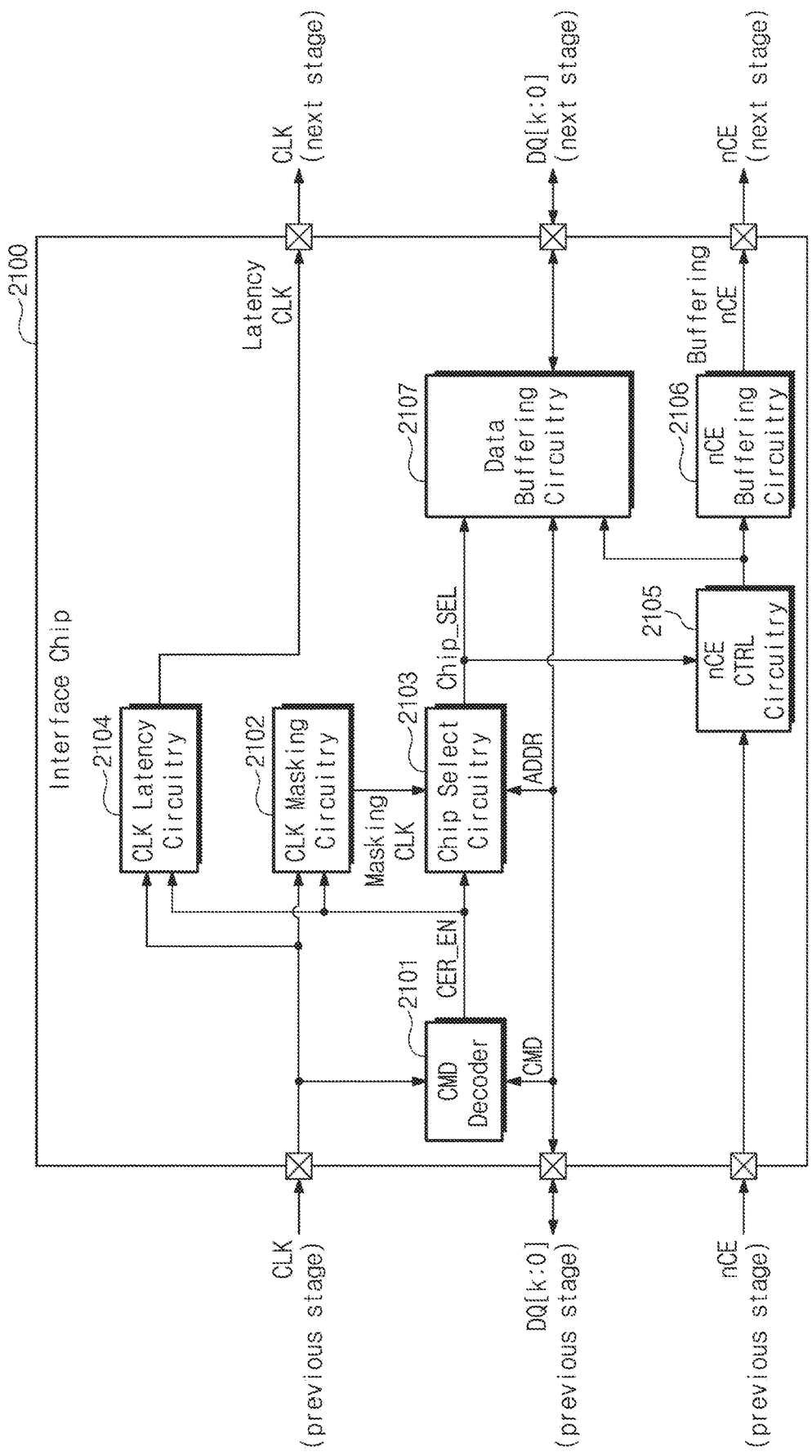
FIG. 3 illustrates a block diagram of an interface chip of FIG. 2.

FIG. 3 illustrates a block diagram of an interface chip of FIG. 2. In some example embodiments, one or more of the interface chips 2110_1 and 2120_1, 2110_2 to 2140_2 . . . 2110_n–1 to 2130_n–1 of FIG. 2 may be an interface chip 2100 of FIG. 3. In some example embodiments, interface chips 2110_1 and 2120_1, 2110_2 to 2140_2 . . . 2110_n–1 to 2130_n–1 of FIG. 2 may be identical to each other and/or may be manufactured identically. In some example embodiments, at least some such interface chips may be different and/or may be manufactured differently.

In some example embodiments, the interface chip 2100 may be configured to receive a clock signal CLK and/or a chip enable signal nCE from a previous stage of a stage to which the interface chip 2100 belongs. In example embodiments in which the interface chip 2100 belongs to the first stage, the interface chip 2100 may be configured to receive the above signals from the controller 1000. The interface chip 2100 may be configured to transmit the clock signal CLK and/or the chip enable signal nCE to a next stage of the stage to which the interface chip 2100 belongs. The interface chip 2100 may be configured to receive data input/output signals DQ[k:0] (k being an integer of 1 or more) from the previous stage and/or to transmit the data input/output signals DQ[k:0] to the next stage. In reverse, the interface chip 2100 may be configured to receive the data input/output signals DQ[k:0] from the next stage and/or to transmit the data input/output signals DQ[k:0] to the previous stage. In some example embodiments, the interface chip 2100 may include command decoder 2101, clock masking circuitry 2102, chip select circuitry 2103, clock latency circuitry 2104, chip enable control circuitry 2105, chip enable buffering circuitry 2106, and/or data buffering circuitry 2107.

In some example embodiments, the command decoder 2101 may be configured to receive the clock signal CLK, and/or to receive and/or decode a command CMD included in the data input/output signals DQ[k:0] based on the clock signal CLK. The command decoder 2101 may be configured to sample the data input/output signals DQ[k:0] at an edge (e.g., a rising edge or a falling edge) of the clock signal CLK and/or to decode the command CMD issued by the controller 1000 based on logical values (e.g., logic 1 or logic 0) of the sampled data input/output signals DQ[k:0]. In some example embodiments, the logical values of the data input/output signals DQ[k:0] according to the command CMD may comply with the above-described interface standard. For example, the controller 1000 may be configured to issue a chip enable reduction command CER_CMD for selecting a target memory chip and/or to transmit the data input/output signals DQ[k:0] including logical values according to the chip enable reduction command CER_CMD to a semiconductor chip(s) of the first stage. Afterwards, semiconductor chips of the first stage may be configured to transmit the chip enable reduction command CER_CMD to one or more semiconductor chips of the second stage. In the above-described manner, the chip enable reduction command CER_CMD may be transmitted to the first to n-th stages in sequence. The command decoder 2101 may be configured to receive logical values according to the chip enable reduction command CER_CMD and/or to generate or activate a CER enable signal CER_EN.

In some example embodiments, the clock masking circuitry 2102 may be configured to receive the clock signal CLK and/or to generate a masking clock signal Masking CLK based on the CER enable signal CER_EN. For example, the clock masking circuitry 2102 may be configured to output the clock signal CLK as the masking clock signal Masking CLK without modification based on the CER enable signal CER_EN not being activated. In some example embodiments, the clock masking circuitry 2102 may be configured to operate as a buffer that receives the clock signal CLK, amplifies the clock signal CLK, and/or transmits the clock signal CLK to any other circuit.

In some example embodiments, the clock masking circuitry 2102 may be configured to include, in the masking clock signal Masking CLK, a first edge of the clock signal CLK that is input to the interface chip 2100 after a time point when the chip enable reduction command CER_CMD is input to the interface chip 2100 based on the CER enable signal CER_EN being activated. For example, the clock masking circuitry 2102 may transmit only one edge in the masking clock signal Masking CLK based on the chip enable reduction command CER_CMD. In some example embodiments, an edge included in the masking clock signal Masking CLK based on chip enable reduction command CER_CMD may correspond to the first edge of the clock signal CLK output from the controller 1000 based on the data input/output signals DQ[k:0] including the chip enable reduction command CER_CMD are output from the controller 1000. As described above, an edge may be a rising edge and/or a falling edge.

In some example embodiments, based on the control of the clock masking circuitry 2102 may cause some or all edges after the first edge of the clock signal CLK which is input to the interface chip 2100 and the time point when the chip enable reduction command CER_CMD is input to the interface chip 2100 may be excluded from and/or masked in the masking clock signal Masking CLK. For example, the clock masking circuitry 2102 may be configured to block or mask all the edges after the first edge of the clock signal CLK which is input to the interface chip 2100 after the time point when the chip enable reduction command CER_CMD is input to the interface chip 2100. That is, the clock masking circuitry 2102 may be configured to toggle the masking clock signal Masking CLK in response to (e.g., corresponding to) the first edge of the clock signal CLK which is input to the interface chip 2100 after the time point when the chip enable reduction command CER_CMD is input to the interface chip 2100, and thereafter may refrain from toggling the masking clock signal Masking CLK. The term "toggling," as used herein, indicates an operation in which a logical state of the masking clock signal Masking CLK is changed.

In some example embodiments, the chip select circuitry 2103 may be configured to sample an address ADDR included in the data input/output signals DQ[k:0] based on the CER enable signal CER_EN and/or the masking clock signal Masking CLK. some example embodiments, the chip select circuitry 2103 may be configured to sample the address ADDR included in the data input/output signals DQ[k:0] at an edge of the masking clock signal Masking CLK based on the chip enable reduction command CER_CMD input to the interface chip 2100 and/or the CER enable signal CER_EN being activated by the command decoder 2101.

In some example embodiments, one edge of the masking clock signal Masking CLK after the time point when the chip enable reduction command CER_CMD is input to the interface chip 2100 may correspond to the first edge of the clock signal CLK input to the interface chip 2100 after the time point when the chip enable reduction command CER_CMD is input to the interface chip 2100. For example, the chip select circuitry 2103 may be configured to perform the sampling of the address ADDR only once after the chip enable reduction command CER_CMD is input to the interface chip 2100 based on the one edge.

In some example embodiments, the chip select circuitry 2103 may be configured to compare the sampled address with an internal address and to generate and/or activate a chip select signal Chip_SEL based on the sampled address and/or the internal address, which in some example embodiments may be determined and/or stored in advance. For example, the internal address may be used to select one or more semiconductor chips included in one or more stages. For example, internal addresses respectively stored in advance in the interface chips 2110_2 to 2140_2 of the second stage of FIG. 2 may be different. An internal address may be stored in a register (not illustrated) (e.g., a one-time programmable (OTP) memory) of the interface chip 2100. In an example embodiments, the chip select circuitry 2103 may be configured to activate the chip select signal Chip_SEL based on a determination that a sampled address corresponds to (e.g., matches) an internal address stored in advance.

In some example embodiments, the clock latency circuitry 2104 may be configured to receive the clock signal CLK and/or to generate a latency clock signal Latency CLK based on the CER enable signal CER_EN. For example, he latency clock signal Latency CLK may be transmitted to the next stage of a stage to which the interface chip 2100 belongs. That is, the latency clock signal Latency CLK may be used as the clock signal CLK of an interface chip(s) of the next stage.

In some example embodiments, the clock latency circuitry 2104 may be configured to output the clock signal CLK as the latency clock signal Latency CLK without modification based on the CER enable signal CER_EN not being activated. In this case, the clock latency circuitry 2104 may be configured to operate as a buffer that receives the clock signal CLK, amplifies the clock signal CLK, and/or transmit the clock signal CLK to the next stage.

In some other example embodiments, under the control of the clock latency circuitry 2104, the first edge of the clock signal CLK which is input to the interface chip 2100 after the time point when the chip enable reduction command CER_CMD is input to the interface chip 2100 may be excluded from and/or masked in the latency clock signal Latency CLK based on the CER enable signal CER_EN being activated. For example, the clock latency circuitry 2104 may be configured to block and/or exclude the first edge of the clock signal CLK which is input to the interface chip 2100 after the time point when the chip enable reduction command CER_CMD is input to the interface chip 2100. In some example embodiments, under the control of the clock latency circuitry 2104, some or all edges after the first edge of the clock signal CLK which is input to the interface chip 2100 after the time point when the chip enable reduction command CER_CMD is input to the interface chip 2100 may be included in the latency clock signal Latency CLK. That is, in some example embodiments, the clock masking circuitry 2102 and the clock latency circuitry 2104 may be configured to perform opposite operations with respect to the first edge and the following edges of the clock signal CLK.

In some example embodiments, the clock latency circuitry 2104 be configured to refrain from toggling the latency clock signal Latency CLK based on the first edge of the clock signal CLK which is input to the interface chip 2100 after the time point when the chip enable reduction command CER_CMD is input to the interface chip 2100, and/or to toggle the latency clock signal Latency CLK based on one or more edges after the first edge of the clock signal CLK which is input to the interface chip 2100 after the time point when the chip enable reduction command CER_CMD is input to the interface chip 2100. As another example, the clock latency circuitry 2104 may be configured to exclude the first edge of the clock signal CLK from the latency clock signal Latency CLK (e.g., by delaying the clock signal CLK) based on the CER enable signal CER_EN being activated.

In some example embodiments, the chip enable control circuitry 2105 may be configured to receive the chip enable signal nCE. Here, "n" of the chip enable signal nCE may indicate a default logical state of the chip enable signal nCE (e.g., logic 1). In some example embodiments, the number of the chip enable signal nCE per channel CH may be one, which may indicate one channel CH. In some example embodiments, the controller 1000 may be configured to use the chip enable signal nCE to select one or more semiconductor chips per stage.

In some example embodiments, the chip enable control circuitry 2105 may be configured to provide and/or output the chip enable signal nCE to the chip enable buffering circuitry 2106 and/or the data buffering circuitry 2107 based on the chip select signal Chip_SEL being activated. In some example embodiments, the chip enable control circuitry 2105 may refrain from providing the chip enable signal nCE to the chip enable buffering circuitry 2106 and the data buffering circuitry 2107 based on the chip select signal Chi-SEL not being activated.

In some example embodiments, the chip enable buffering circuitry 2106, which is a buffer, may be configured to receive the chip enable signal nCE from the chip enable control circuitry 2105; amplify the chip enable signal nCE; and/or transmit a buffering chip enable signal Buffering nCE to the next stage of a stage to which the interface chip 2100 belongs. In some example embodiments, the buffering chip enable signal Buffering nCE may be substantially identical to the chip enable signal nCE provided from the chip enable control circuitry 2105. For example, the buffering chip enable signal Buffering nCE may be used as the chip enable signal nCE of semiconductor chips of the next stage. In other example embodiments, the buffering chip enable signal Buffering nCE may be substantially different than the chip enable signal nCE provided from the chip enable control circuitry 2105.

In some example embodiments, a chip select signal Chip_SEL may be activated only at one selected from the interface chips 2100 in one stage by the operation of the chip select circuitry 2103 and/or the control of the controller 1000. For example, even though the chip enable signal nCE is transmitted to the interface chips 2100 of any one stage, only one interface chip 2100 of one stage selected by the controller 1000 may transmit the chip enable signal nCE to the next stage. In example embodiments in which one interface chip 2100 is selected for each stage and only the selected interface chip 2100 outputs the chip enable signal nCE to the next stage, only one chip enable signal nCE may be transmitted from each stage to each successive stage, and/or the chip enable signal nCE may be transmitted only by one path between the controller 1000 and the first stage.

In some example embodiments, the data buffering circuitry 2107 may be configured to receive data input/output signals DQ[k:0] from the previous stage and/or to transmit the data input/output signals DQ[k:0] to the next stage based on the chip select signal Chip_SEL and/or the chip enable signal nCE. For example, the data buffering circuitry 2107 may provide and/or transmit the data input/output signals DQ[k:0] to the next stage based on the chip select signal Chip_SEL being activated and/or the chip enable signal nCE being provided from the chip enable control circuitry 2105. In some example embodiments, the data input/output signals DQ[k:0] output from the data buffering circuitry 2107 may be the data input/output signals DQ[k:0] of the next stage.

In some example embodiments, the data buffering circuitry 2107 may be configured to receive the data input/output signals DQ[k:0] from the next stage and/or to transmit the data input/output signals DQ[k:0] to the previous stage based on the chip select signal Chip_SEL and the chip enable signal nCE. For example, the data buffering circuitry 2107 may provide or output the data input/output signals DQ[k:0] to the previous stage based on the chip select signal Chip_SEL being activated and/or the chip enable signal nCE being provided by the chip enable control circuitry 2105. In some example embodiments, the data input/output signals DQ[k:0] output from the data buffering circuitry 2107 may be the data input/output signals DQ[k:0] of the previous stage.

In some example embodiments, after the controller 1000 issues the chip enable reduction command CER_CMD, sequentially generates first to n-th addresses, and/or selects first to n-th semiconductor chips of the first to n-th stages, the data buffering circuitry 2107 of each of the first to (n−1)-th semiconductor chips may be configured to operate as a buffer, for example, by receiving the data input/output signals DQ[k:0] from a previous stage and then transmitting the data input/output signals DQ[k:0] to a next stage. Program data may be transmitted from the controller 1000 to an n-th semiconductor chip of the n-th stage through the data buffering circuitry 2107 of the first to (n−1)-th semiconductor chips, and/or read data may be transmitted from the n-th semiconductor chip of the n-th stage to the controller 1000 through the data buffering circuitry 2107 of the (n−1)-th to first semiconductor chips.

In some example embodiments, the data buffering circuitry 2107 may be configured to refrain from performing the above-described operations based on the chip select signal Chip_SEL not being activated and/or based on the chip select signal Chip_SEL not being provided from the chip enable control circuitry 2105.

In some example embodiments, each of the components of the interface chip 2100 may be implemented in the form of hardware by using a logic gate, a buffer, a driver, an amplifier, a transmitter, a receiver, etc. In some example embodiments, the interface chip 2100 may further include circuitry configured to transmit one or more other control signals defined with regard to a channel.

Figure 4:
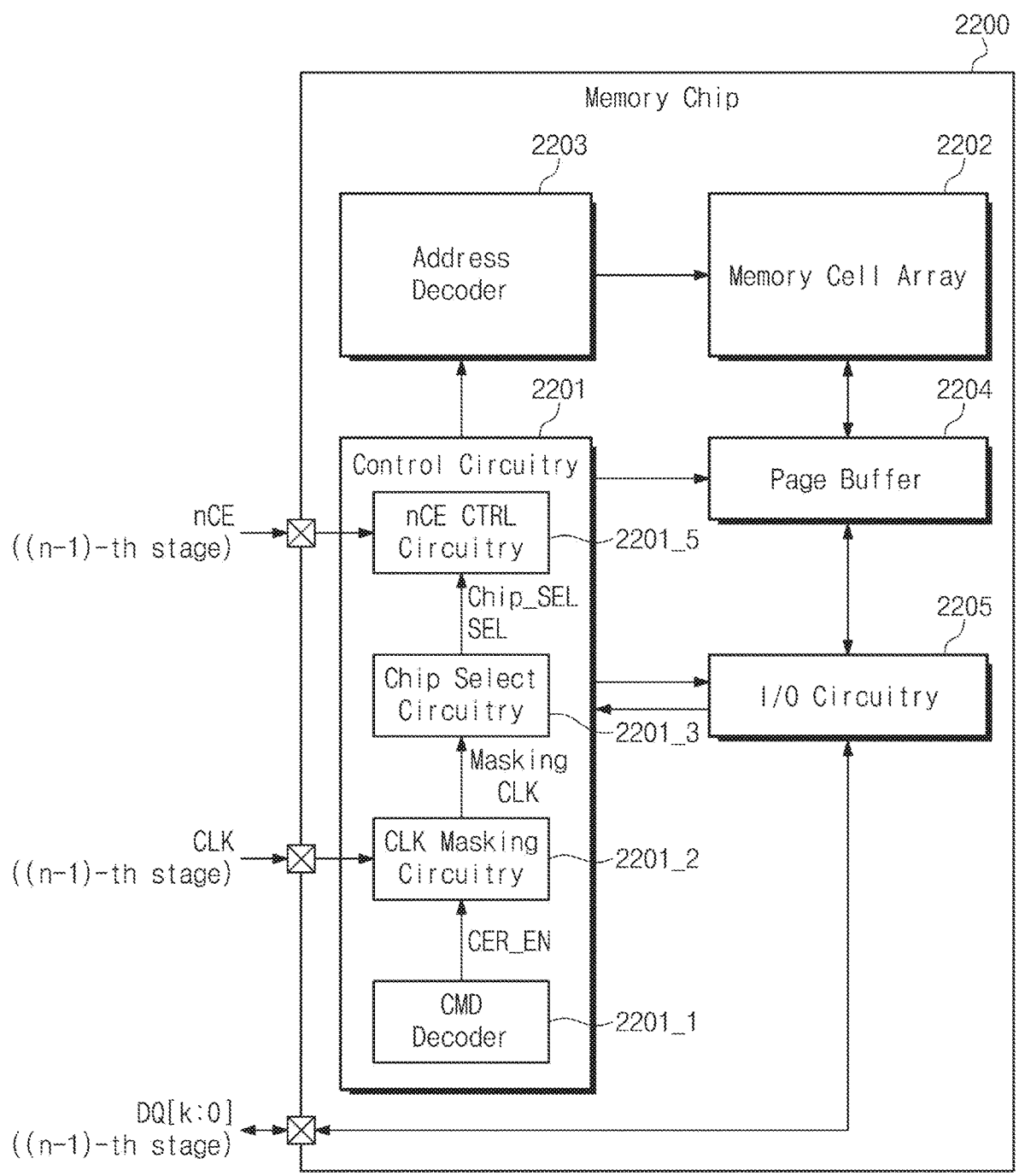
FIG. 4 illustrates a block diagram of a memory chip of FIG. 2.

FIG. 4 illustrates a block diagram of some example embodiments of a memory chip, such as the memory chip of FIG. 2. In some example embodiments, the memory chips 2210_n to 2230_n of FIG. 2 may include a memory chip 2200 of FIG. 4. In some example embodiments, one or more of memory chips 2210_n to 2230_n of FIG. 2 may be identical to each other and/or may be manufactured identically. In some example embodiments, one or more such memory chips may differ from and/or may be manufactured differently from other such memory chips.

In some example embodiments, one or more of the memory chip 2200 may be configured to receive the clock signal CLK and the chip enable signal nCE from the (n−1)-th stage. In example embodiments including a memory chip 2200 included in the n-th stage which is the last stage, the memory chip 2200 may be configured to refrain from transmitting the clock signal CLK and/or the chip enable signal nCE to any other stage. In some example embodiments, one or more memory chips 2200 may be configured to receive the data input/output signals DQ[k:0] from the (n−1)-th stage and/or to transmit the data input/output signals DQ[k:0] to the (n−1)-th stage. In some example embodiments, one or more memory chips 2200 may include a control circuitry 2201, a memory cell array 2202, address decoder 2203, a page buffer 2204, and/or input/output circuitry 2205.

In some example embodiments, the control circuitry 2201 may be configured to operate and/or control one or more other components of the memory chip 2200. For example, the control circuitry 2201 may be configured to perform, in a substantially identical manner, operations of the interface chip 2100 other than operations in which the interface chip 2100 transmits the clock signal CLK, the chip enable signal nCE, and/or the data input/output signals DQ[k:0] to a next stage. For example, the control circuitry 2201 may be configured to operate and/or control one or more other components of the memory chip 2200, including performing, in a substantially identical manner, operations in which the interface chip 2100 receives and/or processes the clock signal CLK, the chip enable signal nCE, and/or the data input/output signals DQ[k:0] from a previous stage and/or transmits the data input/output signals DQ[k:0] to the previous stage.

In some example embodiments and unlike the illustration of FIG. 4, the control circuitry 2201 may be configured to receive the data input/output signals DQ[k:0] from the input/output circuitry 2205, and/or to receive the data input/output signals DQ[k:0] input directly from the memory chip 2200. In some example embodiments, the control circuitry 2201 may be configured to receive the command CMD and/or the address ADDR included in the data input/output signals DQ[k:0] that are issued and/or generated by the controller 1000 through the first to (n−1)-th interface chips of the first to (n−1)-th stages selected by the controller 1000.

In some example embodiments, the command CMD may be a chip enable reduction command CER CMD, and the control circuitry 2201 may configured to perform a substantially identical series of operations in which the interface chip 2100 receives and/or processes the chip enable reduction command CER_CMD. For example, the control circuitry 2201 may include command decoder 2201_1, clock masking circuitry 2201_2, chip select circuitry 2201_3, and/or chip enable control circuitry 2201_5. In some example embodiments, the command decoder 2201_1, the clock masking circuitry 2201_2, the chip select circuitry 2201_3, and/or the chip enable control circuitry 2201_5 of the control circuitry 2201 may be substantially identical to the command decoder 2101, the clock masking circuitry 2102, the chip select circuitry 2103, and/or the chip enable control circuitry 2205 of the interface chip 2100 of FIG. 3, respectively.

In some example embodiments, the command decoder 2201_1 may be configured to decode the chip enable reduction command CER_CMD and/or to activate the CER enable signal CER_EN. In some example embodiments, the clock masking circuitry 2201_2 may generate the masking clock signal Masking CLK, including the first edge of the clock signal CLK which is input to the memory chip 2200 after a time point when the chip enable reduction command CER_CMD is input to the memory chip 2200, based on the CER enable signal CER_EN being activated. In some example embodiments, the clock masking circuitry 2201_2 may be configured to exclude and/or mask, in the masking clock signal Masking CLK, one or more edges after the first edge of the clock signal CLK which is input to the memory chip 2200 after the time point when the chip enable reduction command CER_CMD is input to the memory chip 2200. That is, the clock masking circuitry 2201_2 may be configured to block and/or mask some or all of the edges after the first edge of the clock signal CLK which is input to the memory chip 2200 after the time point when the chip enable reduction command CER_CMD is input to the memory chip 2200.

In some example embodiments, the chip select circuitry 2201_3 may be configured to sample the address ADDR included in the data input/output signals DQ[k:0] at an edge of the masking clock signal Masking CLK. For example, the chip select circuitry 2201_3 may be configured to activate the chip select signal Chip_SEL based on a determination that the sampled address corresponds to (e.g., matches) the internal address stored in advance.

In some example embodiments, the controller 1000 may be configured to select one of memory chips included in the n-th stage based on the internal address. For example, internal addresses that are respectively stored in advance in the memory chips 2210_n to 2230_n of the n-th stage of FIG. 2 may be different. An internal address may be stored in a register (not illustrated) (e.g., an OTP memory) of the memory chip 2200.

In some example embodiments, the chip enable control circuitry 2201_5 of the control circuitry 2201 may be configured to receive the chip enable signal nCE, and/or to determine that the chip enable signal nCE is valid based on the chip select signal Chip_SEL being activated (e.g., the chip enable control circuitry 2201_5 may evaluate the chip enable signal nCE only when the chip select signal Chip_SEL is activated). For example, the chip select signal Chip_SEL may be activated only at one of the memory chips 2210_n to 2230_n of the n-th stage of FIG. 2, and/or the chip select signal Chip_SEL may be deactivated at the remaining memory chips. Accordingly, even though the memory chips 2210_n to 2230_n of the n-th stage may receive the chip enable signal nCE, only the memory chip for which the chip select signal Chip_SEL is activated may determine whether the chip enable signal nCE is valid.

In some example embodiments, the control circuitry 2201 may be configured to receive and/or process various commands (e.g., a program command (or a write command), a read command, an erase command, etc.) input to the memory chip 2200 based on a determination that the chip enable signal nCE is valid. The control circuitry 2201 may be configured to control one or more other components of the memory chip 2200 depending on the above-described commands.

In some example embodiments, the memory cell array 2202 may include memory cells connected to word lines (not illustrated) and/or bit lines (not illustrated). For example, a memory cell may be a dynamic random access memory (DRAM) cell, a static random access memory (SRAM) cell, a thyristor random access memory (TRAM) cell, a NAND flash memory cell, a NOR flash memory cell, a resistive random access memory (RRAM) cell, a ferro- electric random access memory (FRAM) cell, a phase change random access memory (PRAM) cell, a magnetic random access memory (MRAM) cell, etc.

In some example embodiments, the address decoder 2203 may be configured to control the memory cell array 2202 under control of the control circuitry 2201; to receive an address from the control circuitry 2201; to activate memory cells corresponding to the address; to activate and/or deactivate at least one word line and at least one bit line corresponding to the address; and/or to select memory cells.

In some example embodiments, the page buffer 2204 may be configured to store read data output from the memory cell array 2202 and/or to program data to be programmed in the memory cell array 2202, based on control of the control circuitry 2201. For example, a size of the data stored in the page buffer 2204 may correspond to a page size of the memory chip 2200 determined in advance, and/or a page size may correspond to a number of memory cells connected to at least one word line. In some example embodiments, the page buffer 2204 may be configured to program the program data in the selected memory cells of the memory cell array 2202 as a write driver and/or to sense and/or amplify read data from the selected memory cells of the memory cell array 2202 as a sense amplifier.

In some example embodiments, the input/output circuitry 2205 may be configured to receive the read data from the page buffer 2204 and/or to transmit data input/output signals DQ[k:0] including the read data to the (n−1)-th stage. For example, the input/output circuitry 2205 may be configured to receive the data input/output signals DQ[k:0] including program data from an (n−1)-th stage and/or to transmit the program data to the page buffer 2204. Also, the input/output circuitry 2205 may be configured to receive the data input/output signals DQ[k:0] including the command CMD or the address ADDR and/or to transmit the command CMD and/or the address ADDR to the control circuitry 2201.

Figure 5:
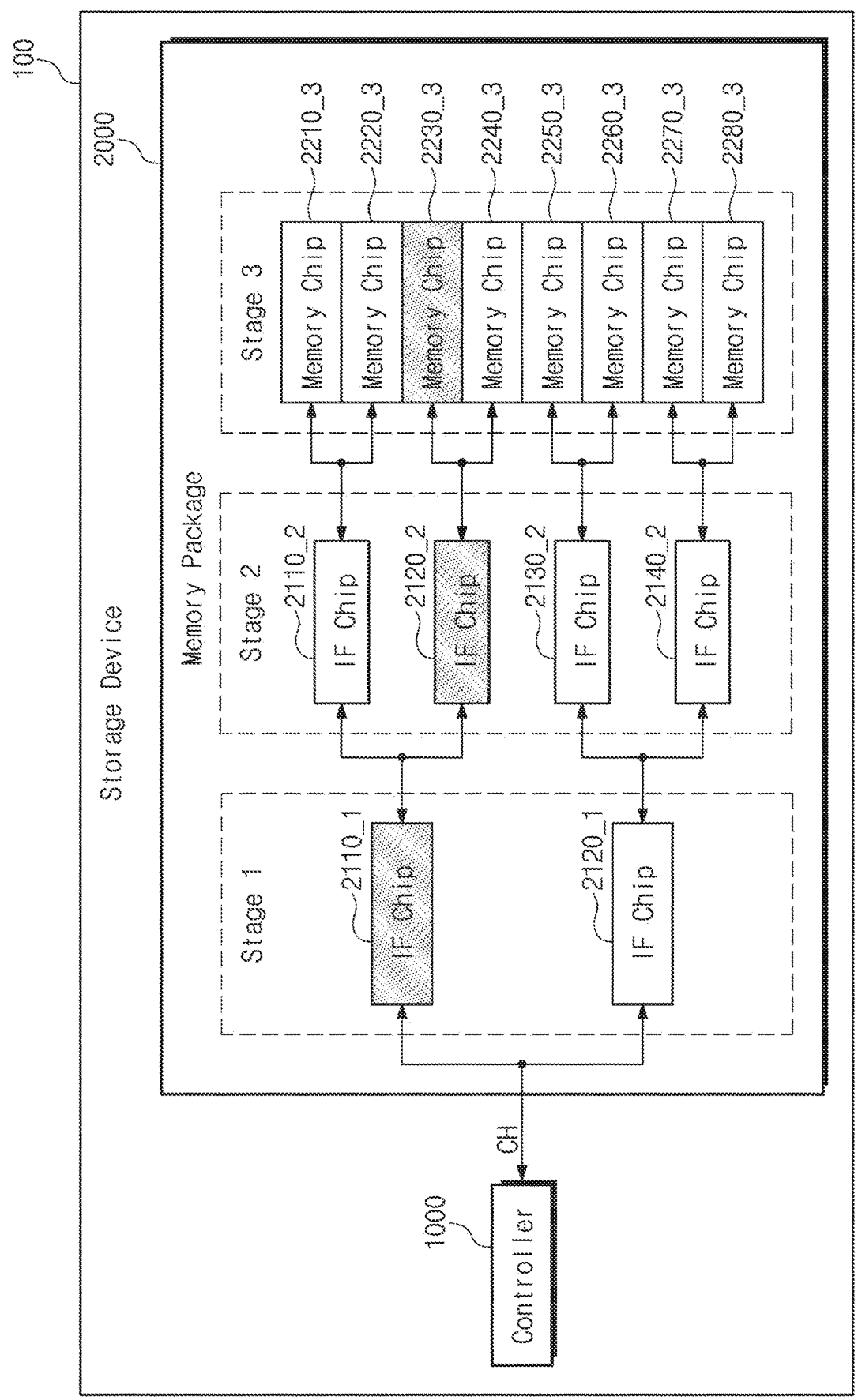
FIG. 5 illustrates semiconductor chips which a controller of FIG. 2 selects at first to third stages.
Figure 6:
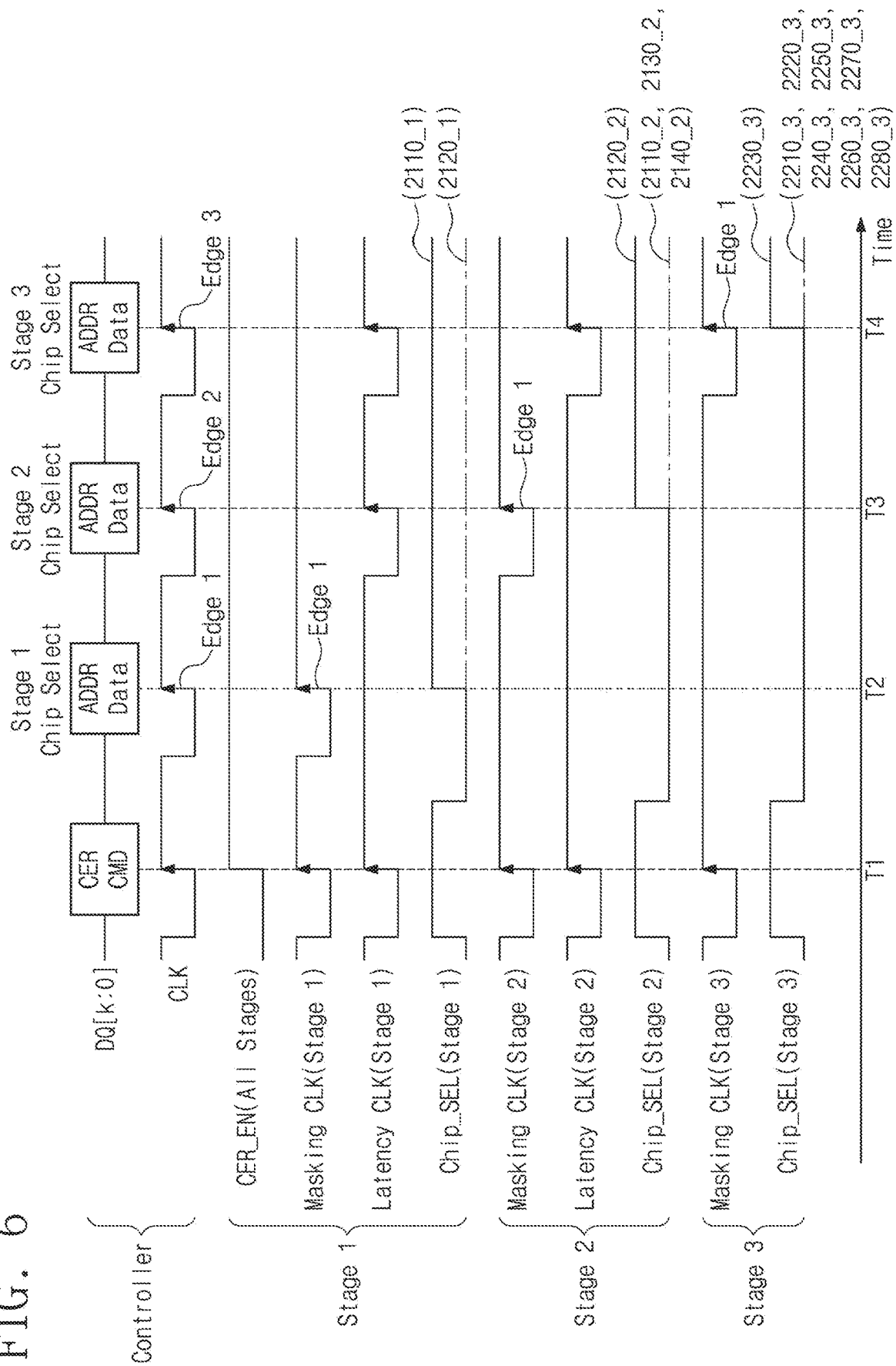
FIG. 6 illustrates an example timing diagram in which a controller, such as the controller of FIG. 2, selects semiconductor chips at a first, second, and third stage of a memory package of a storage device.

FIG. 5 illustrates an example embodiment of semiconductor chips, including interface chips 2100 and memory chips 2200, that may be selected by a controller of FIG. 2 at a first, second, and third stage of a memory package 2000. FIG. 6 illustrates an example timing diagram of signals by which an example embodiment that may cause a selection of semiconductor chips by a controller of FIG. 2 in a first, second, and third stage of a memory package 2000. FIGS. 5 and 6 will be described together.

The example memory package 2000 of the example embodiment of a storage device 100 of FIG. 5 includes first, second, and third stages (i.e., in FIG. 2, "n" being 3), wherein the first stage includes two interface chips 2110_1 and 2120_1, the second stage includes four interface chips 2110_2 to 2140_2, and the third stage includes eight memory chips 2210_3 to 2280_3. in the example embodiment of a storage device 100 of FIG. 5, the controller 1000 is connected to two semiconductor chips (which may be interface chips 2100), and one interface chip is connected to two semiconductor chips (which may be interface chips 2100 or memory chips 2200). In the example embodiment of a storage device 100 of FIG. 5, the controller 1000 is configured to select one interface chip 2110_1 of the first stage, select one interface chip 2230_3 of the second stage, and select one memory chip 2110_3 of the third stage. Referring to FIG. 5, semiconductor chips selected by the controller 1000 are shaded. The memory chip 2230_3 may be a target memory chip which the controller 1000 is configured to select.

Some example embodiments may involve a transmission of signals such as illustrated in the example timing diagram of FIG. 6. For example, at a time point T1, a controller 1000 may issue a chip enable reduction command CER_CMD to interface chips 2110_1 and 2120_1 of the first stage, such as by transmitting data input/output signals DQ[k:0] including the chip enable reduction command CER_CMD. The interface chips 2110_1 and 2120_1 of the first stage may be configured to transmit the data input/output signals DQ[k:0] including the chip enable reduction command CER_CMD to the interface chips 2110_2 to 2140_2 of the second stage. The interface chips 2110_2 to 2140_2 of the second stage may be configured to transmit the data input/output signals DQ[k:0] including the chip enable reduction command CER_CMD to the memory chips 2210_3 to 2280_3 of the third stage.

As further illustrated in the example timing diagram of FIG. 6, a controller 1000 may be configured to transmit (e.g., by broadcast) the chip enable reduction command CER_CMD to some or all the semiconductor chips 2110_1 and 2120_1, 2110_2 to 2140_2, and 2210 3 to 2280_3 of the memory package 2000. Each of the semiconductor chips 2110_1 and 2120_1, 2110_2 to 2140_2, and 2210_3 to 2280_3 may be configured to activate the CER enable signal (refer to FIGS. 3 and 4) based on the chip enable reduction command CER_CMD. In some example embodiments that correspond to the example timing diagram of FIG. 6, time points when the CER enable signal CER_EN are activated at the semiconductor chips 2110_1 and 2120_1, 2110_2 to 2140_2, and 2210_3 to 2280_3 may be identical to each other. In other example embodiments, such time points may be different from each other, for example, depending on time points when the chip enable reduction command CER_CMD is transmitted and/or times spent decoding the chip enable reduction command CER_CMD.

In some example embodiments, one or more of the semiconductor chips 2110_1 and 2120_1, 2110_2 to 2140_2, and 2210_3 to 2280_3 may be configured to receive the chip enable reduction command CER_CMD from the controller 1000 or a previous stage and/or may transmit the chip enable reduction command CER_CMD to a next stage. For example, one or more of the semiconductor chips 2110_1 and 2120_1, 2110_2 to 2140_2, and 2210_3 to 2280_3 may be configured to receive the chip enable reduction command CER_CMD, to receive the address ADDR, and/or to activate the chip select signal Chip_SEL based on a determination of whether the address ADDR corresponds to an internal address (refer to FIGS. 3 and 4). In some example embodiments, the controller 1000 may be configured to transmit additional control signals to the first, second, and third stages so that one or more the semiconductor chips 2110_1 and 2120_1, 2110_2 to 2140_2, and 2210_3 to 2280_3 may receive and/or transmit the chip enable reduction command CER_CMD. Similarly, one or more of the semiconductor chips 2110_1 and 2120_1, 2110_2 to 2140_2, and 2210_3 to 2280_3 may be configured to receive and/or transmit the chip enable reduction command CER_CMD based on the additional control signals. For example, the interface chips 2110_1 and 2120_1 of the first stage may be configured to receive the additional control signals and to transmit the additional control signals to the second stage; and the interface chips 2110_2 to 2140_2 of the second stage may be configured to receive the additional control signals and to transmit the additional control signals to the third stage.

In some example embodiments, the controller 1000 may be configured to transmit the clock signal CLK to the interface chips 2110_1 and 2120_1 of the first stage. The interface chips 2110_1 and 2120_1 of the first stage may be configured to receive the clock signal CLK and/or to transmit the latency clock signal Latency CLK to the second stage as the clock signal CLK of the second stage. The interface chips 2110_2 and 2140_2 of the second stage may be configured to receive the clock signal CLK and/or to transmit the latency clock signal Latency CLK to the third stage as the clock signal CLK of the third stage. One or more of the semiconductor chips 2110_1 and 2120_1, 2110_2 to 2140_2, and 2210_3 to 2280_3 may be configured to sample the data input/output signals DQ[k:0] including the chip enable reduction command CER_CMD based on the clock signal CLK received from a previous stage and/or a controller 1000. Respective interface chips 2110_1 and 2120_1 and 2110_2 to 2140_2 may be configured to transmit the same latency clock signal Latency CLK as the received clock signal CLK to a next stage based on the CER enable signal CER_EN not being activated and/or the chip enable reduction command CER_CMD not being received.

As further illustrated in the example timing diagram of FIG. 6, a controller 1000 may toggle the clock signal CLK based on the number of the first to third stages and the chip enable reduction command CER_CMD. For example, the controller 1000 may toggle the clock signal CLK as much as the number of the first to the third stages after the chip enable reduction command CER_CMD. Accordingly, the clock signal CLK generated and/or transmitted by the controller 1000 may include first, second, and third edges Edge 1, Edge 2, and Edge 3 in sequence at T2 to T4. In some example embodiments and in the example timing diagram of FIG. 6, the order of the first, second, and third edges Edge 1, Edge 2, and Edge 3 may correspond to a placement order of the first to third stages forming paths through which signals are transmitted from the controller 1000 to the target memory chip 2230_3. In the example timing diagram illustrated in FIG. 6, each of the first, second, and third edges Edge 1, Edge 2, and Edge 3 may be a rising edge. Other example embodiments may exhibit signal timing patterns that differ from the illustration of FIG. 6; for example, the placement order of the sequence of edges may not correspond to the sequence of stages.

As further shown in the example timing diagram of FIG. 6, at time point T2, a controller 1000 may transmit, to the first stage, data input/output signals DQ[k:0] including an address indicating the interface chip 2110_1 of a semiconductor chip of the first stage that is to be selected. Each of the interface chips 2110_1 and 2120_1 may sample the data input/output signals DQ[k:0] including the address at the first edge "Edge 1" of the masking clock signal Masking CLK. For example, the first edge "Edge 1" of the masking clock signal Masking CLK of the first stage may correspond to the first edge "Edge 1" of the clock signal CLK after the chip enable reduction command CER_CMD. In the example illustration of FIG. 6, both edges are formed identically at the time point T2, but the first edge "Edge 1" of the masking clock signal Masking CLK of the first stage is positioned after the first edge "Edge 1" of the clock signal CLK after the chip enable reduction command CER_CMD. The interface chip 2120_1 may deactivate the chip select signal Chip_SEL based on a determination that the address specified in the command does not correspond to (e.g., does not match) the internal address of the interface chip 2120_1, and the interface chip 2110_1 may activate the chip select signal Chip_SEL based on a determination that the address specified in the command corresponds to (e.g., matches) the internal address of the interface chip 2110_1 (selection of the first stage completed).

As further shown in the example timing diagram of FIG. 6, at time point T3, the controller 1000 may transmit, to the first stage, the data input/output signals DQ[k:0] including an address indicating the interface chip 2120_2 to be selected at the second stage. The chip enable control circuitry 2105 of the interface chip 2120_1 of the first stage may block the chip enable signal nCE based on the chip select signal Chip_SEL being deactivated at the interface chip 2120_1 of the first stage. Accordingly, the interface chip 2120_1 of the first stage may receive the chip enable signal nCE and/or the data input/output signals DQ[k:0] including the address, but may refrain from transmitting the chip enable signal nCE and the data input/output signals DQ[k:0] including the address to the interface chips 2130_2 and 2140_2 of the second stage. Afterwards, the chip select signals Chip_SEL of the interface chips 2130_2 and 2140_2 may be deactivated.

As further shown in the example timing diagram of FIG. 6, the chip select signal Chip_SEL is activated at the interface chip 2110_1 of the first stage. Accordingly, the interface chip 2110_1 of the first stage may receive the chip enable signal nCE and/or the data input/output signals DQ[k:0] including the address, and/or may transmit the chip enable signal nCE and the data input/output signals DQ[k:0] including the address to the interface chips 2110_2 and 2120_2 of the second stage.

As further shown in the example timing diagram of FIG. 6, each of the interface chips 2110_1 and 2120_1 may sample the data input/output signals DQ[k:0] including the address at the first edge "Edge 1" of the masking clock signal Masking CLK. For example, the first edge "Edge 1" of the masking clock signal Masking CLK of the second stage may correspond to the second edge "Edge 2" of the clock signal CLK. In the example timing diagram illustrated in FIG. 6, both edges are formed identically at the time point T3, but the first edge "Edge 1" of the masking clock signal Masking CLK of the second stage is positioned after the second edge "Edge 2" of the clock signal CLK after the chip enable reduction command CER_CMD. The interface chip 2110_2 may deactivate the chip select signal Chip_SEL based on the address in the data input/output signals not corresponding to the internal address of the interface chip 2110_2. The interface chip 2120_2 may activate the chip select signal Chip_SEL based on the address in the data input/output signals corresponding to (e.g., matching) the internal address of the interface chip 2120_2 (selection of the second stage completed).

In some example embodiments, an address transmitted to an interface chip of the second stage (such as 2120_2) may indicate another interface chip (such as 2140_2). In other example embodiments, the chip enable signal nCE and the data input/output signals DQ[k:0] including the address may not be transmitted to the interface chips 2130_2 and 2140_2, and only one interface chip 2120_2 may be selected at the second stage. That is, the chip enable signal n_CE may only be transmitted to the interface chip 2100 and/or memory chip 2200 identified by an address included in the data input/output signals DQ[k:0] and may not be transmitted to other interface chips 2100 and/or memory chips 2200 of the same stage that are not identified by an address included in the data input/output signals DQ[k:0].

As further shown in the example timing diagram of FIG. 6, at time point T4, the controller 1000 may transmit, to the first stage, the data input/output signals DQ[k:0], including an address indicating the memory chip 2230_3 to be selected at the third stage. Since the chip select signal Chip_SEL is deactivated at the interface chip 2120_1 of the first stage, the interface chip 2120_1 of the first stage refrains from transmitting the chip enable signal nCE and the data input/output signals DQ[k:0] including the address, and the chip select signals Chip_SEL may be deactivated at the interface chips 2130_2 and 2140_2 of the second stage and the memory chips 2250_3 to 2280_3 of the third stage, since the chip select signal Chip_SEL is deactivated at the interface chip 2110_2 of the second stage and the interface chip 2110_2 of the second stage does not transmit the chip enable signal nCE and the data input/output signals DQ[k:0] including the address, the chip select signals Chip_SEL may be deactivated at the memory chips 2210_3 and 2220_3 of the third stage. In contrast, since the chip select signals Chip_SEL are activated at the interface chip 2110_1 of the first stage and the interface chip 2120_2 of the second stage, the interface chip 2120_2 of the second stage may transmit the chip enable signal nCE and the data input/output signals DQ[k:0] including the address to the memory chips 2230_3 and 2240_3 of the third stage.

As further shown in the example timing diagram of FIG. 6, each of the memory chips 2230_3 and 2240_3 may sample the data input/output signals DQ[k:0] including the address at the first edge "Edge 1" of the masking clock signal Masking CLK. The first edge "Edge 1" of the masking clock signal Masking CLK of the third stage may correspond to the third edge "Edge 3" of the clock signal CLK. In the example timing diagram of FIG. 6, both edges are formed identically at the time point T4, but the first edge "Edge 1" of the masking clock signal Masking CLK of the third stage may be positioned after the third edge "Edge 3" of the clock signal CLK after the chip enable reduction command CER_CMD. The memory chip 2240_3 may deactivate the chip select signal Chip_SEL based on the address specified in the data input/output signals DQ[k:0] not corresponding to an internal address of the memory chip 2240_3. The memory chip 2230_3 may activate the chip select signal Chip_SEL based on the address specified in the data input/output signals DQ[k:0] corresponding to an internal address of the memory chip 2230_3 (selection of the third stage completed).

Figure 7:
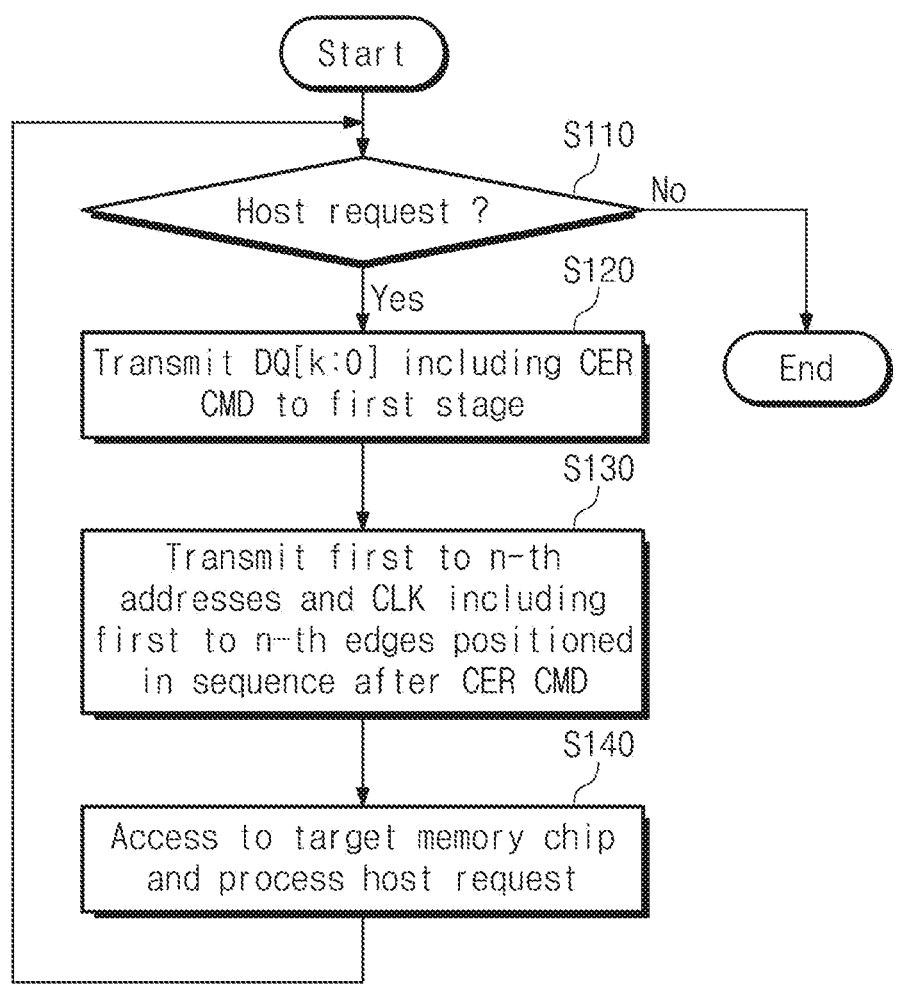
FIG. 7 illustrates a flowchart of an operation in which a storage device according to some example embodiments of some inventive concepts is configured to select semiconductor chips.

FIG. 7 illustrates a flowchart of an example operation of a storage device according to some example embodiments of some inventive concepts is configured to select semiconductor chips. FIG. 7 will be described with reference to FIGS. 2, 5, and 6.

In operation S110, an example embodiment (e.g., a controller 1000) may determine whether a host request exists. On condition that the host request exists (Yes), the example embodiment (e.g., a controller 1000) may perform operation S120. On condition that the host request does not exist (No), the example embodiment (e.g., a controller 1000) may wait until a host request is issued.

In operation S120, the example embodiment (e.g., a controller 1000) may transmit the data input/output signals DQ[k:0] including the chip enable reduction command CER_CMD to at least one semiconductor chip in a first stage of a memory package 2000. The example embodiment (e.g., a controller 1000) may also transmit the chip enable signal nCE indicating a channel for the data input/output signals DQ[k:0] to the at least one semiconductor chip in the first stage of the memory package 2000. As described with reference to FIG. 6, the example embodiment (e.g., the controller 1000) may transmit a chip enable reduction command CER_CMD, directly or indirectly, to one or more semiconductor chips of the first to n-th stages of the storage device 100. Also, the example embodiment (e.g., the controller 1000) may transmit the chip enable signal nCE, directly or indirectly, to one or more semiconductor chips of the first to n-th stages of the storage device 100 together with the chip enable reduction command CER_CMD.

In operation S130, the example embodiment (e.g., the controller 1000) may transmit, to one or more semiconductor chips of the first stage of the memory package 2000, a clock signal CLK including first to n-th edges (refer to the first, second, and third edges Edge 1, Edge 2, and Edge 3 of FIG. 6), wherein the first to n-th edges are positioned, arranged, and/or generated in sequence based on the chip enable reduction command CER_CMD. In some example embodiments, the first to n-th edges may be identified as edges of a periodic clock signal that occur after the transmission, receipt, and/or decoding of the command. In some example embodiments, based on chip enable reduction command CER_CMD that is transmitted to one or more semiconductor chips of the first to n-th stages of the memory package 2000, a clock signal CLK transmitted to the one or more semiconductor chips of the first stage may not be transmitted in identical form to the semiconductor chips of second to n-th stages of the memory package 2000. Rather, in some example embodiments, at least some interface chips 2100 of the first to n-th stages may receive the clock signal CLK and/or may transmit the latency clock signal Latency CLK to a next stage of the memory package 2000, wherein the latency clock signal Latency CLK is the clock signal CLK of the next stage. Some example embodiments (e.g., some controllers 1000) may transmit first to n-th addresses synchronized with the clock signal CLK including the first to n-th edges to one or more semiconductor chips of the first stage.

Although not shown in the flowchart of FIG. 7, in some example embodiments (such as a controller 1000), the transmitting S120 and/or transmitting S130 may be based on a selection of a first interface chip 2100 corresponding to the first address among the interface chips of the first stage at the first edge of the clock signal CLK. Similarly, in some example embodiments (such as a controller 1000), the transmitting S130 may be based on a selection of second to (n−1)-th interface chips that respectively correspond to the second to (n−1)-th addresses among the interface chips of the second to (n−1)-th stages at the second to (n−1)-th edges of the clock signal CLK. An example embodiment (e.g., the controller 1000) may be configured to select an n-th memory chip corresponding to the n-th address among the memory chips of the n-th stage at the n-th edge of the clock signal CLK, to select the first to (n−1)-th interface chips of the first to (n−1)-th stages, and/or to select the n-th memory chip. That is, in some example embodiments, the n-th memory chip, which is a target memory chip, may correspond to (e.g., may be identified by) some or all of the first to n-th addresses.

In some example embodiments, the first to n-th semiconductor chips (i.e., the first to (n−1)-th interface chips and/or the n-th memory chip) of the first to n-th stages, respectively, may be configured to sample the first to n-th addresses based on the first to n-th edges of the clock signal CLK output from the controller 1000. The first to (n−1)-th semiconductor chips of the first to (n−1)-th stages, respectively, may be configured to receive the chip enable signal nCE from the controller 1000 and the first to (n−2)-th semiconductor chips of the first to (n−2)-th stages based on the first to (n−1)-th edges of the clock signal CLK output from the controller 1000, and/or to transmit the chip enable signal nCE to the second to n-th semiconductor chips of the second to n-th stages.

In operation S140 of FIG. 7, an example embodiment (e.g., a controller 1000) may be configured to access a target memory chip to perform an operation(s) on the target memory chip depending on the host request, and may thereby process the host request. Some example embodiments may operate in accordance with the example flowchart of FIG. 7 by accessing a target memory chip depending on the host request. Other example embodiments may be configured to access and/or manage the target memory chip without the host request, including moving data of the target memory chip to any other memory chip, and/or accessing the target memory chip to update information about the target memory chip.

Figure 8:
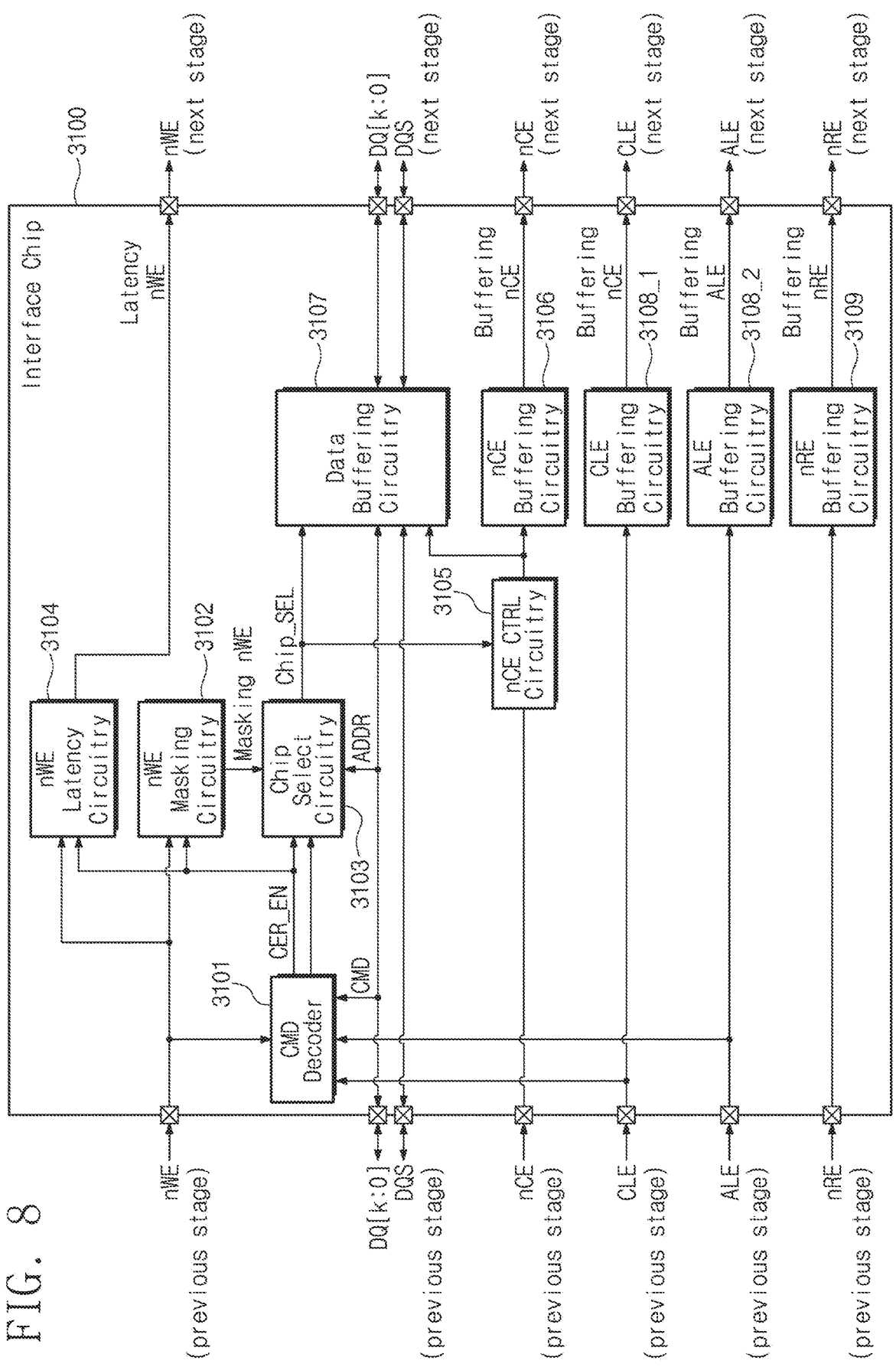
FIG. 8 illustrates a block diagram of an interface chip of FIG. 2 according to some embodiments of some inventive concepts.

FIG. 8 illustrates a block diagram of an interface chip of FIG. 2 according to some example embodiments of some inventive concepts. FIG. 8 will be described with reference to FIG. 3. An interface chip 3100 of FIG. 8 is associated with example embodiments in which each of the memory chips 2210_n to 2230_n of FIG. 2 is a NAND flash memory chip.

In the block diagram of FIG. 8, the interface chip 3100 includes the command decoder 3101, write enable masking circuitry 3102, chip select circuitry 3103, write enable latency circuitry 3104, chip enable control circuitry 3105, chip enable buffering circuitry 3106, and data buffering circuitry 3107. In some example embodiments, a configuration and/or operation of the above components 3101 to 3107 may be substantially identical to the configuration and/or operation of similar circuitry components 2101 to 2107 of the interface chip 2100. In some example embodiments, the configuration and/or operation of at least some components of the interface chip 3100 may vary from the configuration and/or operation of similar components in other example embodiments described herein. For example, an interface chip 2100 may be configured to receive the clock signal CLK, and/or an interface chip 3100 may be configured to receive a write enable signal nWE. As another example, a controller 1000 may be configured to generate the write enable signal nWE to be identical or similar to the above-described clock signal CLK and/or to transmit the write enable signal nWE to the first stage instead of the clock signal CLK. Accordingly, in some example embodiments, command decoder 3101, write enable masking circuitry 3102, and/or write enable latency circuitry 3104 of the interface chip 3100 may be configured to operate based on a write enable signal nWE instead of a clock signal CLK. For example, a write enable signal nWE may cause one or more components to sample and/or latch a command and/or an address included in the data input/output signals DQ[k:0].

In some example embodiments, an interface chip 3100 may include command latch enable buffering circuitry 3108_1, address latch enable buffering circuitry 3108_2, and/or read enable buffering circuitry 3109. In some example embodiments, command latch enable buffering circuitry 3108_1, address latch enable buffering circuitry 3108_2, and read enable buffering circuitry 3109 may be buffers that are respectively configured to receive, from a controller 1000 and/or from one or more semiconductor chips of a previous stage, a command latch enable signal CLE, an address latch enable signal ALE, and a read enable signal nRE. In some example embodiments, command latch enable buffering circuitry 3108_1, address latch enable buffering circuitry 3108_2, and/or read enable buffering circuitry 3109 may be configured to transmit to one or more semiconductor chips of a next stage, respectively, a command latch enable signal CLE, an address latch enable signal ALE, and a read enable signal nRE. In some example embodiments, a command latch enable signal CLE may indicate that one or more logical values (e.g., bits) of the data input/output signals DQ[k:0] are a command. In some example embodiments, an address latch enable signal ALE may indicate that one or more logical values (e.g., bits) of the data input/output signals DQ[k:0] are an address. In some example embodiments, a read enable signal nRE may be used (e.g., by a controller 1000) to provide a clock signal to memory chips of an n-th stage, for example, to cause such memory chips to receive read data. In some example embodiments, a command latch enable signal CLE, an address latch enable signal ALE, and/or a read enable signal nRE may be transmitted to any other stage regardless of the chip enable signal nCE.

In some example embodiments, command decoder 3101 may be configured to activate a chip select signal Chip_SEL based on a command latch enable signal CLE and/or an address latch enable signal ALE before a chip enable reduction command CER_CMD is input to the interface chip 3100. An interface chip 3100 may be configured to, on condition of receiving a chip enable reduction command CER_CMD while a chip select signal Chip_SEL is activated, transmit the chip enable reduction command CER_CMD to one or more semiconductor chips of a next stage. That is, command decoder 3101 may be configured to control data buffering circuitry 3107 based on a command latch enable signal CLE and/or an address latch enable signal ALE, such that the chip enable reduction command CER_CMD may be transmitted to one or more semiconductor chips of a next stage.

Figure 9:
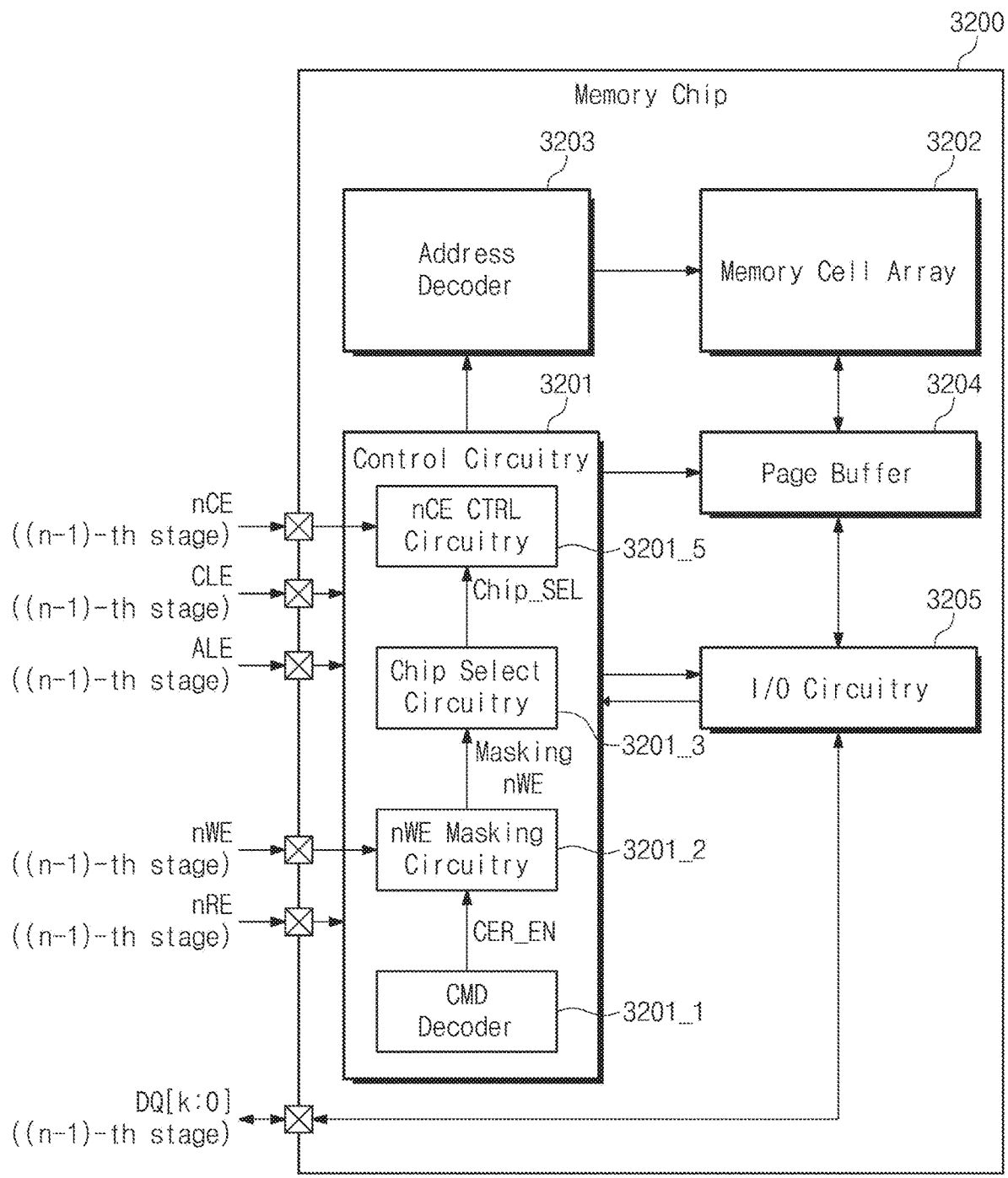
FIG. 9 illustrates a block diagram of a memory chip of FIG. 2 according to some example embodiments of some inventive concepts.

FIG. 9 illustrates a block diagram of a memory chip of FIG. 2 according to some example embodiments of some inventive concepts. FIG. 9 will be described with reference to the example embodiment of FIG. 4. An example embodiment of a memory chip 3200, such as shown in FIG. 9, may be or may include a NAND flash memory chip. The memory chip 3200 may include control circuitry 3201, a memory cell array 3202, address decoder 3203, a page buffer 3204, and/or input/output circuitry 3205. In some example embodiments, the configuration and/or operation of one or more of the above components 3201 to 3205 may be substantially identical to corresponding components in other example embodiments described herein, such as components 2201 to 2205 of the memory chip 2200. In some example embodiments, the configuration and/or operation of one or more of the above components 3201 to 3205 may differ from the configuration and/or operation of similar components as described in other example embodiments. In some example embodiments, control circuitry 3201 may receive a write enable signal nWE instead of the clock signal CLK. The control circuitry 3201 may include a command decoder 3201_1, a write enable masking circuitry 3201_2, a chip select circuitry 3201_3, and a chip enable control circuitry 3201_5. In some example embodiments, configuration and/or operation of the above components 3201_1 to 3201_5 may be substantially identical to the configuration and/or operation of corresponding components in other example embodiments described herein, such as the components 2201_1 to 2201_5 of the control circuitry 2201. In some example embodiments, the configuration and/or operation of one or more of the above components 3201 to 3205 may differ from the configuration and/or operation of similar components as described in other example embodiments. In some example embodiments, control circuitry 3201 may be configured to operate based on the write enable signal nWE instead of the clock signal CLK. In some example embodiments, control circuitry 3201 may be configured to receive a command latch enable signal CLE and/or an address latch enable signal ALE, and/or to latch a command and/or an address included in the data input/output signals DQ[k:0]. In some example embodiments, control circuitry 3201 may be configured to receive the read enable signal nRE and/or to provide the read enable signal nRE to the input/output circuitry 3205.

In some example embodiments, a memory cell array 3202 may include memory blocks (not illustrated), where each memory block includes nonvolatile memory cells (e.g., NAND flash memory cells). For example, a memory block may correspond to a data erase unit.

Figure 10:
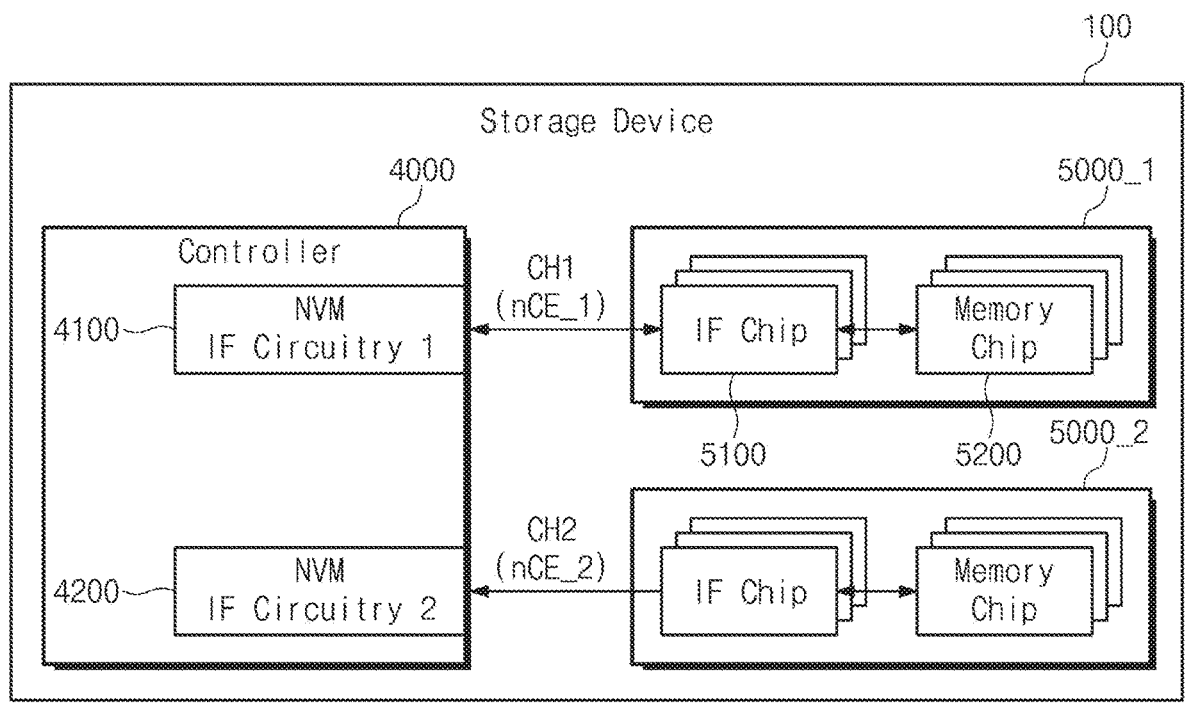
FIG. 10 illustrates a block diagram of a storage device according to some example embodiments of some inventive concepts.

FIG. 10 illustrates a block diagram of a storage device according to some example embodiments of some inventive concepts. In some example embodiments, a storage device 100 may include a controller 4000, a first memory package 5000_1, and/or a second memory package 5000_2. In some example embodiments, a configuration and/or operation of the controller 4000 may be substantially identical to a configuration and/or operation of the controller 1000 described above. Additionally, in some example embodiments, a configuration and/or operations of a first memory package 5000_1 and/or the second memory package 5000_2 may be substantially identical to the configuration and/or operation of the memory package 2000 described above. In some example embodiments, the configuration and/or operation of a controller 4000 and/or memory package 2000 may differ from the configuration and/or operation of similar components as described in other example embodiments.

In some example embodiments, a controller 4000 may be configured to communicate with the first memory package 5000_1 through a first channel CH1. For example, a controller 4000 may be configured to communicate with a second memory package 5000_2 through a second channel CH2. In some example embodiments, a controller 4000 may include a first non-volatile memory (NVM) interface circuitry 4100 configured to transmit and/or receive signals through the first channel CH1 and/or a second NVM interface circuitry 4200 configured to transmit and/or receive signals through the second channel CH2. In some example embodiments, a first chip enable signal nCE_1 may indicate the first channel CH1; a second chip enable signal nCE_2 may indicate the second channel CH2; and/or at least one of the first and second chip enable signals nCE_1 and nCE_2 may correspond to the above-described chip enable signal nCE.

In some example embodiments, the first memory package 5000_1 and/or the second memory packages 5000_2 may include interface chips 5100 and/or memory chips 5200. In some example embodiments, a configuration and/or operation of the interface chips 5100 and/or the memory chips 5200 may be substantially identical to the configuration and/or operation of the interface chips 2100 and 3100 and/or the memory chips 2200 and 3200 described above. An example is illustrated in FIG. 10, in which one channel is allocated to each of the first and second memory packages 5000_1 and 5000_2, but the number of channels allocated to the first and second memory packages 5000_1 and 5000_2 may be one or more. In some example embodiments, a controller 1000 may be configured to communicate with the first and second memory packages 5000_1 and 5000_2 through one or more channels, and the number of the first and second memory packages 5000_1 and 5000_2 is not limited to illustration of FIG. 10.

According to some example embodiments of some inventive concepts, even though a number of memory chips of a storage device may vary, one interface chip may be selected for each stage. Accordingly, a number of paths through which chip enable signals for selecting memory chips are transmitted may decrease.

Some components of some example embodiments, including (without limitation) controller 1000, command decoder 2101, 2201_1, 3101, 3201_1, clock masking circuitry 2102, 2201_2, 3102, 3201_2, chip select circuitry 2103, 2201_3, 3103, 3201_3, clock latency circuitry 2104, 2201_4, 3104, 3201_4, chip enable control circuitry 2105, 2201_5, 3105, 3201_5, chip enable buffering circuitry 2106, 3106, data buffering circuitry 2107, control circuitry 2201, 3201, I/O circuitry 2205, command latch enable buffering circuitry 3108_1, address latch enable buffering circuitry 3108_2, read enable buffering circuitry 3109, address decoder 3203, I/O circuitry 3205, and/or non-volatile memory interface circuitry 4100, 4200, may include processing circuitry such as hardware including logic circuits; a hardware/software combination, such as a processor executing software; or a combination thereof. For example, a processor may include, but is not limited to, a central processing unit (CPU), a graphics processing unit (GPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some inventive concepts have been described with reference to some example embodiments thereof, it will be apparent to those of ordinary skill in the art that various changes and modifications may be made thereto without departing from the spirit and scope of such some inventive concepts, which are limited only by the claims appended hereto.

What is claimed is:

1. An interface chip comprising:
a command decoder configured to decode a command included in data input/output signals based on a clock signal;
clock masking circuitry configured to generate a masking clock signal including an edge corresponding to a first edge among first to n-th edges of the clock signal (n being an integer of 2 or more);
clock latency circuitry configured to transmit, to an external chip, a latency clock signal including edges corresponding to second to n-th edges of the clock signal;
chip select circuitry configured to generate a chip select signal based on an address included in the data input/output signals and the masking clock signal; and
chip enable control circuitry configured to,
receive a chip enable signal indicating a channel for the data input/output signals, and
transmit the chip enable signal to the external chip based on the chip select signal.

2. The interface chip of claim 1, wherein the clock masking circuitry is configured to generate the masking clock signal by masking the second to n-th edges of the clock signal.

3. The interface chip of claim 1, wherein the clock latency circuitry is configured to delay the clock signal to exclude the first edge of the clock signal from the latency clock signal.

4. The interface chip of claim 1, wherein the chip select circuitry is configured to activate the chip select circuitry based on the address included in the data input/output signals corresponding to an internal address.

5. The interface chip of claim 4, wherein the chip enable control circuitry is configured to transmit the chip enable signal to the external chip based on the chip select signal being activated.

6. The interface chip of claim 1, further comprising:
data buffering circuitry configured to,
receive the data input/output signals, and
transmit the data input/output signals to the external chip based on the chip select signal and the chip enable signal.

7. The interface chip of claim 6, wherein
the interface chip includes,
command latch enable buffering circuitry configured to,
receive a command latch enable signal, and
transmit the command latch enable signal to the external chip, and
address latch enable buffering circuitry configured to,
receive an address latch enable signal, and
transmit the address latch enable signal to the external chip, and
the command decoder is configured to control the data buffering circuitry to transmit the command to the external chip through the data buffering circuitry based on the command latch enable signal and the address latch enable signal.

8. A storage device comprising:
a controller configured to generate data input/output signals including a command, first to n-th addresses, and a clock signal including first to n-th edges (n being an integer of 2 or more); and
semiconductor chips of first to n-th stages configured to decode the command included in the data input/output signals and respectively sample the first to n-th addresses based on the first to n-th edges of the clock signal,
wherein the controller is configured to select semiconductor chips of the first to n-th stages that respectively correspond to the first to n-th addresses.

9. The storage device of claim 8, wherein
the semiconductor chips of a first to (n−1)th stages are interface chips, and
the semiconductor chips of an n-th stage are memory chips.

10. The storage device of claim 8, wherein
the controller is further configured to generate a chip enable signal that indicates a channel for the data input/output signals,
wherein, when "n" is 2, a semiconductor chip of a first stage is configured to respectively determine whether to transmit the chip enable signal to a second stage based on the first address, and
wherein, when "n" is greater than 2, the semiconductor chips of first to (n−1)-th stages are configured to respectively determine whether to transmit the chip enable signal to the semiconductor chips of second to n-th stages based on first to (n−1)-th addresses, respectively.

11. The storage device of claim 8, wherein
the chip enable signal indicates one channel, and
the controller is configured to transmit the chip enable signal to a semiconductor chips of a first stage through one path.

12. The storage device of claim 8, wherein
the data input/output signals including the command and the first to n-th addresses are first data input/output signals, and the controller is further configured to transmit, to a semiconductor chip of a first stage, second data input/output signals including program data to be programmed in a semiconductor chip of an n-th stage after selecting an n-th semiconductor chip of an n-th stage,
a semiconductor chip of a first stage is configured to receive the second data input/output signals from the controller,
when "n" is 2, the semiconductor chip of the first stage is further configured to transmit the second data input/output signals to semiconductor chips of the n-th stage, and
when "n" is greater than 2, the semiconductor chips of second to (n−1)-th stages are configured to, respectively,
receive the second data input/output signals from the controller through the semiconductor chips of first to (n−2)-th stages, and
transmit the second data input/output signals to the semiconductor chips of second to n-th stages.

13. The storage device of claim 8, wherein
the data input/output signals including the command and the first to n-th addresses are first data input/output signals,
semiconductor chips of an n-th stage are configured to,
generate second data input/output signals including read data, and
transmit the second data input/output signals to the semiconductor chips of an (n−1)-th stage,
when "n" is 2, the semiconductor chips of the (n−1)-th stage are configured to, respectively,
receive the second data input/output signals from a semiconductor chip of the n-th stage, and
transmit the second data input/output signals to the controller, and
when "n" is greater than 2, the semiconductor chips of (n−1)-th to first stages are configured to respectively
receive the second data input/output signals from semiconductor chips of n-th to second stages, and respectively
transmit the second data input/output signals to semiconductor chips of (n−2)-th to first stages and the controller.

14. The storage device of claim 8, wherein, when "n" is greater than 2, the semiconductor chips of first to (n−1)-th stages are identical.

15. A storage device comprising:
semiconductor chips of first to n-th stages ("n" being an integer of 2 or more); and
a controller configured to transmit data input/output signals including a command for selecting a semiconductor chip of the n-th stage, a clock signal including first to n-th edges, and a chip enable signal, to a semiconductor chip of a first stage,
wherein, when "n" is 2, based on a first edge of the clock signal, the semiconductor chip of the first stage is configured to,
receive the chip enable signal from the controller, and
transmit the chip enable signal to a semiconductor chip of the n-th stage, and wherein, when "n" is greater than 2 or more, the semiconductor chips of first to (n−1)-th stages are configured, respectively, to,
receive the chip enable signal from the controller and the semiconductor chips of first to (n−2)-th stages, and
transmit the chip enable signal to the semiconductor chips of second to n-th stages, based on first to (n−1)-th edges of the clock signal.

16. The storage device of claim 15, wherein the controller is configured to transmit the data input/output signals further including first to n-th addresses to the semiconductor chip of the first stage.

17. The storage device of claim 16, wherein
the semiconductor chips of the first to n-th stages are configured, respectively, to,
decode the command, and
sample the first to n-th addresses based on the first to n-th edges of the clock signal, and
the semiconductor chips of the n-th stage are configured to receive the chip enable signal based on an n-th address.

18. The storage device of claim 16, wherein
the semiconductor chip of the first stage is configured to receive the clock signal from the controller,
when "n" is 2, the semiconductor chips of the n-th stage are configured to receive a first latency clock signal from a semiconductor chip of the first stage, and
when "n" is greater than 2, the semiconductor chips of the second to n-th stages are configured, respectively, to receive first to (n−1)-th latency clock signals from a semiconductor chip of the first to (n−1)-th stages, respectively.

19. The storage device of claim 18, wherein
when "n" is 2, the semiconductor chips of the first to n-th stages are configured, respectively, to transmit an edge of the first latency clock signal after a transmission of the command to the semiconductor chips of an n-th stage corresponds to an n-th edge of the clock signal, and
when "n" is greater than 2, the semiconductor chips of the first to n-th stages are configured, respectively, to transmit edges of the first to (n−1)-th latency clock signals after a transmission of the command to second to n-th stages respectively corresponding to second to n-th edges of the clock signal.

20. The storage device of claim 19, wherein
a semiconductor chip of the first stage is configured to sample a first address by using the first edge of the clock signal,
when "n" is 2, the semiconductor chips of the n-th stage are configured to sample an n-th address based on an edge of the first latency clock signal, and
when "n" is greater than 2, the semiconductor chips of the second to n-th stages are configured, respectively, to sample second to n-th addresses based on edges of first to (n−1)-th latency clock signals.

* * * * *